(12) United States Patent
Fujimoto et al.

(10) Patent No.: US 8,395,305 B2
(45) Date of Patent: Mar. 12, 2013

(54) DISPLAY DEVICE AND METHOD OF MANUFACTURING TRANSPARENT SUBSTRATE FOR DISPLAY DEVICE

(75) Inventors: Akira Fujimoto, Kawasaki (JP); Koji Asakawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 38 days.

(21) Appl. No.: 12/410,298

(22) Filed: Mar. 24, 2009

(65) Prior Publication Data
US 2009/0179543 A1    Jul. 16, 2009

Related U.S. Application Data

(62) Division of application No. 10/786,290, filed on Feb. 26, 2004, now Pat. No. 7,524,428.

(30) Foreign Application Priority Data

Feb. 26, 2003    (JP) .................................. 2003-049612

(51) Int. Cl.
*H01L 51/00* (2006.01)
*H01L 51/50* (2006.01)
*H01L 51/52* (2006.01)

(52) U.S. Cl. ......................... 313/110; 313/504; 313/506

(58) Field of Classification Search .......... 313/498–512, 313/110
See application file for complete search history.

(56) References Cited

U.S. PATENT DOCUMENTS

| 4,554,727 A | | 11/1985 | Deckman et al. |
| 5,779,924 A | | 7/1998 | Krames et al. |
| 6,130,504 A | * | 10/2000 | Nakayama et al. ........... 313/584 |
| 6,433,487 B1 | * | 8/2002 | Yamazaki .................. 315/169.3 |
| 6,565,763 B1 | | 5/2003 | Asakawa et al. |
| 6,670,772 B1 | * | 12/2003 | Arnold et al. .............. 315/169.3 |
| 6,762,819 B2 | * | 7/2004 | Lee .............................. 349/156 |
| 6,825,056 B2 | | 11/2004 | Asakawa et al. |
| 6,977,108 B2 | | 12/2005 | Hieda et al. |

(Continued)

FOREIGN PATENT DOCUMENTS

| JP | 4-354382 | 12/1992 |
| JP | 8-167738 | 6/1996 |

(Continued)

OTHER PUBLICATIONS

Y. Kanamori, et al., "100 NM Period Silicon Antireflection Structures Fabricated Using a Porous Alumina Membrane Mask", Applied Physics Letters, vol. 78, No. 2, Jan. 8, 2001, pp. 142-143.

(Continued)

*Primary Examiner* — Karabi Guharay
*Assistant Examiner* — Zachary J Snyder
(74) *Attorney, Agent, or Firm* — Oblon, Spivak, McClelland, Maier & Neustadt, L.L.P.

(57) ABSTRACT

A display device comprises a substrate and a laminate structure formed on the substrate and comprising a plurality of layers including a display region. The laminate structure has a recessed/projected portions at least one of an outermost surface of display side and an interface between the layers. The projected portions of the recessed/projected portions have a mean circle-equivalent diameter ranging from 50 nm to 250 nm with the standard deviation of circle-equivalent diameter of the projected portions being within the range of 10 to 50% of the mean circle-equivalent diameter, and a mean height ranging from 100 nm to 500 nm with the standard deviation of height being within the range of 10 to 50% of the mean height. The projected portions have a circularity coefficient ranging from 0.6 to 1, and an area ratio ranging from 20 to 75%.

4 Claims, 5 Drawing Sheets

U.S. PATENT DOCUMENTS

| | | | |
|---|---|---|---|
| 7,037,738 B2 | 5/2006 | Sugiyama et al. |
| 7,090,784 B2 | 8/2006 | Asakawa et al. |
| 7,097,781 B2 | 8/2006 | Asakawa et al. |
| 7,229,273 B2 | 6/2007 | Bailey et al. |
| 7,306,743 B2 | 12/2007 | Hieda et al. |

FOREIGN PATENT DOCUMENTS

| | | |
|---|---|---|
| JP | 2000-299494 | 10/2000 |
| JP | 2001-74919 | 3/2001 |
| JP | 2002-122702 | 4/2002 |
| JP | 2002287377 A | 10/2002 |

OTHER PUBLICATIONS

Yoshiaki Kanamori, et al., "Broadband Antireflection Gratings for Glass Substrates Fabricated by Fast Atom Beam Etching", Jpn. J. Appl. Phys., vol. 39, Jul. 15, 2000, pp. L735-L737.

Y. Inomata, et al., "Surface Texturing of Large Area Multicrystalline Silicon Solar Cells Using Reactive Ion Etching Method", Solar Energy Materials and Solar Cells, vol. 48, 1997, pp. 237-242.

Park, M. et al., "Block Copolymer Lithography: Periodic Arrays of 10exp11 Holes in 1 Square Centimeter" Science, vol. 276, May 30, 1997, 1401-4.

\* cited by examiner

DISPLAY DEVICE AND METHOD OF MANUFACTURING TRANSPARENT SUBSTRATE FOR DISPLAY DEVICE

CROSS-REFERENCE TO RELATED APPLICATIONS

This application is a divisional of, and is based upon and claims the benefit of priority from U.S. application Ser. No. 10/786,290, filed Feb. 26, 2004, and from prior Japanese Patent Application No. 2003-049612, filed Feb. 26, 2003, the entire contents of each of which are incorporated herein by reference.

BACKGROUND OF THE INVENTION

1. Field of the Invention

The present invention relates to a display device and to a method of manufacturing a transparent substrate for a display device. In particular, the present invention relates to a display device such as an organic EL (electroluminescent) element, a liquid crystal display device and a plasma display, and to a method of manufacturing a transparent substrate to be employed in these devices.

2. Description of the Related Art

A glass substrate, a transparent electrode and an organic film all constituting a display device such as an LCD, a PDP and an organic EL element are generally high in refractive index. As a result, there is a problem that due to the reflection of light by the surface of glass substrate or by the interface at the transparent electrode or the organic film, loss of light is caused to occur. Therefore, it is difficult to effectively retrieve or pick up the light that has been generated in the display device or that has been introduced into the display device.

Since the reflectance as measured from the display face side of the display device is 10 to 15% at the black matrix (BM) of the color filter portion disposed inside the display device and 3 to 5% at the interface between air atmosphere and the face of the display device, problems of reflection and glare are caused to occur.

With a view to solving the aforementioned problems, there have been employed a method wherein multiple layers of materials differing in refractive index from each other are formed as an anti reflection layer on the surface of a display device, and a method wherein a low refractive index material (1.35-1.4) consisting of a fluorine-based compound is coated on the surface of a display device. There is also proposed adopting a low reflection structure ($Cr/CrO_x$ or $Mo/MoO_x$) as a material for constituting the BM portion, thereby making it possible to reduce the reflectance of the display device. However, although the aforementioned anti reflection layer consisting of multiple layers is excellent in terms of performance, it is difficult to control the film thickness, resulting in increase in manufacturing cost. On the other hand, the use of low refractive index materials is effective in reducing the reflectance to 2%, the effect of such a degree is not sufficient. Namely, as long as the BM portion is concerned, even if low refractive index materials are used for that, the reflectance thereof is as high as about 3%, which is still insufficient.

In an effort to enhance the light-retrieving efficiency or to minimize the reflectance, it is now being studied to apply a regular structure of nanometer size to the surface of a semiconductor or glass substrate to obtain a semiconductor or glass substrate which is high in transmittance and low in reflectance. However, since only a regular structure of nanometer size is capable of realizing such anti reflection effects, even the lithography using a latest excimer laser is barely capable of achieving such a fine regular structure. Therefore, in order to realize such a fine regular structure, it is required to use an electron beam and, by using the electron beam, to perform the drawing and etching for creating the aforementioned regular structure. The use of an electron beam however leads to an increase in manufacturing cost as well as to the deterioration of productivity, thus making this method impractical. Moreover, since the regular structure is required to be created in the order of nanometer size, there is little tolerance in the process involved.

Further, there is also known a surface roughening technique wherein the surface to be treated is treated using hydrochloric acid, sulfuric acid, hydrogen peroxide or a mixed solution containing any of these materials. This surface roughening technique however is accompanied with a problem that this technique is greatly influenced by the crystallinity of the substrate and hence the surface of the substrate can be roughened or cannot be roughened depending on the azimuth of the exposed surface thereof. Of course, in the case of amorphous materials such as glass, the surface roughening thereof is fundamentally impossible. Therefore, it is not always possible to achieve the surface-roughening, thus restricting the usefulness of this roughening technique to improving the light retrieving efficiency.

BRIEF SUMMARY OF THE INVENTION

According to one embodiment of the present invention, there is provided a display device comprising: a substrate; a laminate structure formed on the substrate and comprising a plurality of layers including a display region; and recessed/projected portions formed at least one of an outermost surface of display side, an interface of the plurality of layers and an interface between the substrate and the laminate structure, either one of the substrate and the laminate structure having the outermost surface of display side, projected portions of the recessed/projected portions having a mean circle-equivalent diameter ranging from 50 nm to 250 nm with the standard deviation of circle-equivalent diameter of the projected portions being within the range of 10 to 50% of the mean circle-equivalent diameter, and a mean height ranging from 100 nm to 500 nm with the standard deviation of height being within the range of 10 to 50% of the mean height; and the projected portions having a circularity coefficient ranging from 0.6 to 1, and an area ratio ranging from 20 to 75%.

According to another embodiment of the present invention, there is also provided a method for manufacturing a transparent substrate for a display device comprising: forming a polymer layer containing a copolymer selected from block copolymers and graft copolymers on at least one major surface of a transparent substrate; subjecting the polymer layer to annealing treatment to phase-separate the copolymer; removing one of the phases of the copolymer that has been phase-separated to form a mask layer having a pattern formed of the residual phase; and transcribing the pattern of mask layer onto a surface of the transparent substrate, thereby forming a surface-roughened substrate having a large number of recessed/projected portions, projected portions of the recessed/projected portions being meet the following conditions:

(1) a mean circle-equivalent diameter ranging from 50 nm to 250 nm with the standard deviation of circle-equivalent diameter of the projected portions being within the range of 10 to 50% of the mean circle-equivalent diameter;

(2) a mean height ranging from 100 nm to 500 nm with the standard deviation of height being within the range of 10 to 50% of the mean height;

(3) a circularity coefficient ranging from 0.6 to 1; and
(4) an area ratio ranging from 20 to 75%.

According to another embodiment of the present invention, there is also provided a method for manufacturing a transparent substrate for a display device comprising: forming a polymer layer containing a copolymer selected from block copolymers and graft copolymers on a cast molding substrate; subjecting the polymer layer to annealing treatment to phase-separate the copolymer; removing one of the phases of the copolymer that has been phase-separated to form a mask layer having a pattern formed of the residual phase; and transcribing the pattern of mask layer onto a surface of the cast molding substrate, thereby obtaining a cast mold pattern having a large number of recessed/projected portions; forming a resist film on at least one of major surfaces of a transparent substrate; press-contacting the cast mold pattern onto the resist film to form a resist pattern having a large number of recessed/projected portions; and working the transparent substrate by using the resist pattern as a mask, projected portions of the recessed/projected portions being meet the following conditions:

(1) a mean circle-equivalent diameter ranging from 50 nm to 250 nm with the standard deviation of circle-equivalent diameter of the projected portions being within the range of 10 to 50% of the mean circle-equivalent diameter;

(2) a mean height ranging from 100 nm to 500 nm with the standard deviation of height being within the range of 10 to 50% of the mean height;

(3) a circularity coefficient ranging from 0.6 to 1; and
(4) an area ratio ranging from 20 to 75%.

DETAILED DESCRIPTION OF THE INVENTION

Figure 1:
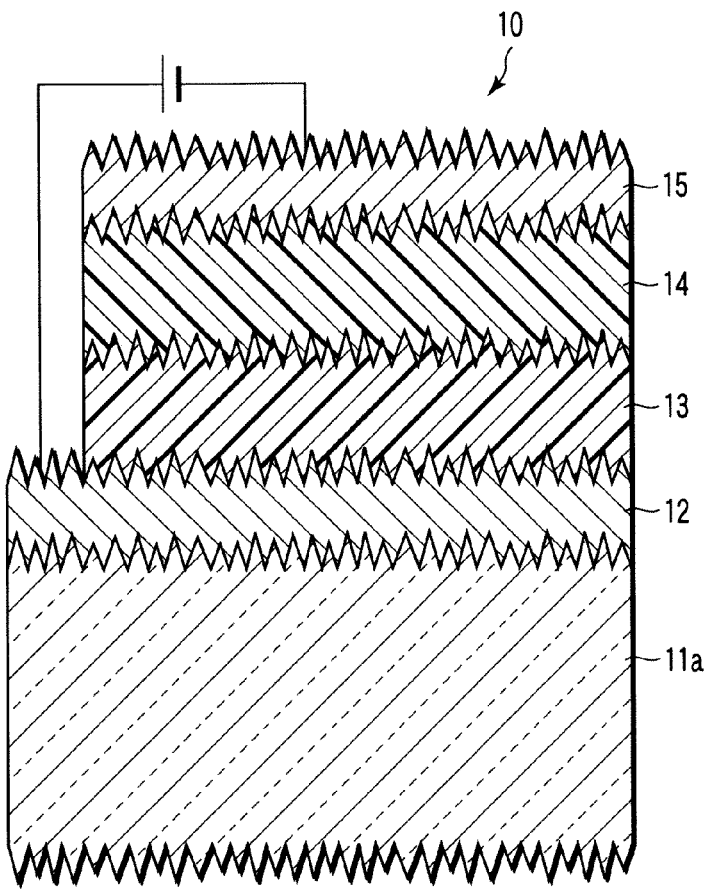
FIG. 1 is a cross-sectional view illustrating the structure of an organic EL element according to one embodiment of the present invention.

First of all, the principle of the present invention will be explained.

The present inventors have made extensive studies on the surface structure as well as interlayer structure of a display device in an attempt to enhance the light-pick up efficiency and to minimize the reflectance of display device. As a result, the present inventor have found out an optimum structure as explained below. Namely, a display device according to one embodiment of the present invention is formed of a laminated element wherein an outermost surface of display side of the laminated element as well as at least one side of interface formed between at least one couple of layers of the laminated element are formed of a finely roughened structure having a large number of recessed/projected portions of the order of nanometer in size (or nanometer size). Moreover, the projected portions are required to meet the following conditions:

(1) a mean circle-equivalent diameter thereof is confined within the range of 50 nm to 250 nm with the standard deviation of circle-equivalent diameter of the projected portions being confined within the range of 10 to 50% of the mean circle-equivalent diameter;

(2) a mean height thereof is confined within the range of 100 nm to 500 nm with the standard deviation of height being confined within the range of 10 to 50% of the mean height;

(3) a circularity coefficient thereof is confined within the range of 0.6 to 1; and (4) an area ratio thereof is confined within the range of 20 to 75%.

The recessed/projected portions can be observed from right above using scanning electron microscope (SEM). The SEM image thus obtained can be analyzed using the particle analysis software ver. 2.0 of Sumitomo metal technology.

In order to improve the transmittance of light and to minimize the reflectance in a layer, the surface structure of the layer is required to be defined by taking the magnitude of reaction of the visible light into consideration.

In the surface structure as well as the interface structure where the scattering of light generates, the influence thereof on light becomes greater as the magnitude of roughness of the surface structure as well as the interface structure becomes larger, the effects of the influence thereof increase in proportion to the square in magnitude of roughness. Therefore, a mean circle-equivalent diameter of the projected portions of the recessed/projected portions should preferably be not less than $\frac{1}{20}$ of the wavelength of the visible light. If the mean circle-equivalent diameter of the projected portions is smaller than this lower limit, the roughness of the surface structure would be caused to fall outside Rayleigh scattering zone, thus causing the effects of the recessed/projected portions to quickly attenuate. Therefore, a more preferable range of the mean circle-equivalent diameter of the projected portions would be not less than $\frac{1}{10}$ of the wavelength of the visible light.

When the mean circle-equivalent diameter of the projected portions is increased to the level of the wavelength of the visible light, or becomes equal to or larger than the wavelength of light, the configuration of the recessed/projected portions per se is recognized by the visible light, thus undesirably resulting in attenuation of the effects of gradient index. More preferably, a mean circle-equivalent diameter of the projected portions should be such that the visible light can no longer recognize the configuration of the recessed/projected portions, or more specifically not more than $\frac{1}{4}$ of the wavelength of the visible light.

Since the wavelength of the visible light is within the range of 400 to 800 nm or so, a mean circle-equivalent diameter of the projected portions is confined within the range of 50 nm to 250 nm, and an area ratio (an occupation ratio) thereof is confined within the range of 20 to 75%. If this area ratio is as small as less than 20%, the size of the flat portions or recessed portions would become equal to or larger than the wavelength of the visible light, thereby the flat portions is recognized by the visible light. On the other hand, if this area ratio exceeds over 75%, the projected portions of the recessed/projected portions contact with each other, thus the circle-equivalent diameter of the projected portions to substantially fall outside the aforementioned defined range. As a result, the configuration of the recessed/projected portions is recognized by the visible light, thus undesirably resulting in attenuation of the effects of gradient index.

If the standard deviation of circle-equivalent diameter of the projected portions is less than 10% of the mean circle-equivalent diameter, the range of wavelength cannot be sufficiently enlarged. On the other hand, if the standard deviation of circle-equivalent diameter of the projected portions exceeds over 50% of the mean circle-equivalent diameter, the display device would be badly influenced by the scattering of light. Accordingly, in the embodiment of the present invention, the standard deviation of circle-equivalent diameter of the projected portions is confined within the range of 10 to 50% of the mean circle-equivalent diameter.

Furthermore, the circularity coefficient of the projected portions is confined to range from 0.6 to 1. This circularity coefficient can be defined by a formula of: $4\pi \times area/(circumferential\ length)^2$. If this circularity coefficient is less than 0.6, the projected portions can hardly be said as being circular. As a result, the existence of the recessed/projected portions can be recognized by the visible light.

With respect to the height of projected portions, the same reasoning as discussed above can be applied thereto. Incidentally, by the term of "height", it can be defined as being a distance from peak to valley. Since the magnitude or size of roughness of the aforementioned recessed/projected portions is smaller than the wavelength of the visible light, individual size of the recessed/projected portions cannot be recognized by the visible light, but only a mean value of size of the recessed/projected portions can be recognized by the visible light. Therefore, if a luminous layer of high refractive index is coexisted with a medium of low refractive index, the refractive index that the visible light can recognize therefrom is a mean value of refractive indexes of a plane which is parallel with the luminous surface where the recessed/projected portions are formed. Thus, it is preferable that this mean value of refractive indexes is gradually decreased starting from the luminous layer to reach, in this manner, to the external portion of the display device. Therefore, in order to provide this refractive index with a suitable gradient, the configuration of each of the projected portions should preferably be as close to cone-shaped as possible.

Specifically, the mean height of the projected portions is required to be not less than 1/10 of the wavelength of the visible light. If this mean height is smaller than this lower limit, the refractive index is caused to vary within a very short distance, so that the effects of the recessed/projected portions would be rapidly attenuated according to the same principle as that where the effects of gradient index are caused to attenuate. Since the effects of the recessed/projected portions are proportional to the square in size of the recessed/projected portions, it would be preferable in order to secure sufficient effects of the recessed/projected portions to confine the mean height of the projected portions to not less than about 1/5 of the wavelength of the visible light. On the other hand, if this mean height is too high, the effects of gradient index would be caused to attenuate. Therefore, it is required that this mean height should be such that the visible light can no longer recognize the configuration of the recessed/projected portions, or more specifically not larger than the wavelength of the visible light. Therefore, the mean height of the projected portions of the recessed/projected portions should be confined within the range of 100 nm to 500 nm.

The aforementioned fine recessed/projected structure having the same size in roughness as the wavelength of the visible light or a smaller size than the wavelength of the visible light, which the visible light can no longer recognize the configuration of the recessed/projected portions can be formed by using the self-organizing power existing in nature.

If the standard deviation of height of the projected portions is less than 10% of the mean height of the projected portions, it would be impossible to secure the effects of gradient index unless the configuration of the projected portions is formed into a cone-shaped configuration. On the other hand, if the standard deviation of the mean height of the projected portions exceeds over 50% of the mean height of the projected portions, the display device would be badly influenced by the scattering of light. Accordingly, in the embodiment of the present invention, the standard deviation of the height of the projected portions is confined within the range of 10 to 50% of the mean height of the projected portions.

Since the self-organized pattern of a block copolymer is utilized, it is not required to use an exposure apparatus using excimer laser or an electron beam drawing apparatus, thereby making it possible to dispense with a large scale equipment investment. Further, since the devices as well as the processes which are now employed for the manufacture of LSI devices can be employed as they are, the present invention can be easily put into practice.

The display device according to the embodiments of the present invention can be used for the manufacture of an organic EL element, an LCD and a PDP.

(Organic EL Element)

FIG. 1 shows a cross-sectional view illustrating the structure of an organic EL element according to one embodiment of the present invention. As shown in FIG. 1, this organic EL element is a light emitting diode of DC driving type, wherein an anode 12, a hole injection layer (hole transport layer) 13, a light emitting layer 14 and a cathode 15 are successively deposited on the surface of a transparent substrate 11a formed of glass or plastics. In the organic EL element 10 shown in FIG. 1, although the recessed/projected portions are formed on the opposite major surfaces of the transparent substrate 11a, the recessed/projected portions having the aforementioned features may be formed only at least one of the major surfaces thereof. There is no other particular limitation except the conditions mentioned above, and hence the construction of layers to be deposited on the transparent substrate can be optionally modified as follows.

1) an electrode (cathode)/a light emitting layer/a hole injection layer/an electrode (anode);

2) an electrode (anode)/a light emitting layer/an electron injection layer/an electrode (cathode);

3) an electrode (anode)/a hole injection layer/a light emitting layer/an electron injection layer (electron transport layer)/an electrode (cathode);

4) an electrode (anode or cathode)/a light emitting layer/an electrode (cathode or anode);

The anode 12 can be formed from an electric conductive material exhibiting a large work function such as indium tin oxide (ITO) for instance. The thickness of the anode 12 may be generally within the range of 80 to 150 nm or so.

A hole injection layer 13 is formed on the surface of the anode 12 by vacuum vapor deposition method, and if required, an electron injection layer may be further formed thereon.

The electron injection layer and the hole injection layer 13 may be any one of layers having electric charge-injecting property, electric charge-transporting property or electric charge-blocking property. The light emitting layer 14 generates light through the recombination of electron with hole. These layers 13 and 14 may be formed by using either an organic material or an inorganic material, the thickness thereof falling within the range of 10 to 300 nm or so.

The cathode 15 can be formed from metals exhibiting a small work function such as aluminum, magnesium, indium, silver or an alloy comprising any one of these metals for instance. The thickness of the cathode 15 may be within the range of 10 to 500 nm or so.

The transparent substrate 11a used in the organic EL element shown in FIG. 1 can be manufactured by the following method.

Figure 2A:
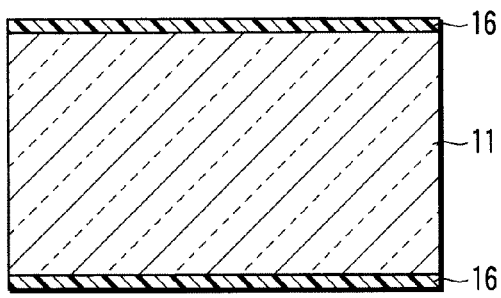
FIGS. 2A to 2C respectively shows a cross-sectional view illustrating in stepwise the method of manufacturing a transparent substrate for display device according to one embodiment of the present invention.
Figure 2B:
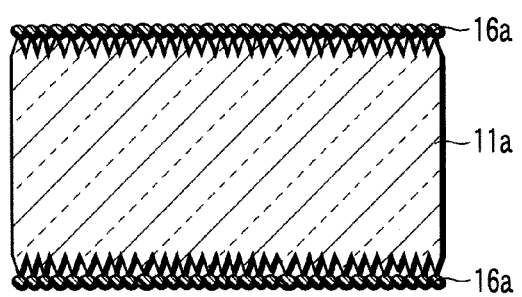
Figure 2C:
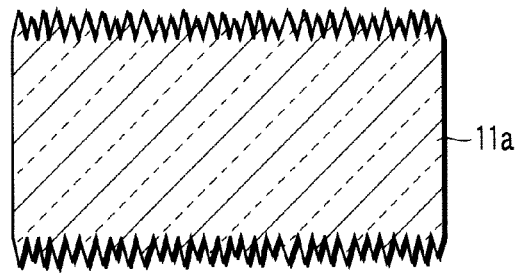

FIGS. 2A to 2C respectively shows a cross-sectional view illustrating in stepwise the method of manufacturing a transparent substrate for display device according to one embodiment of the present invention.

First of all, a solution comprising a block copolymer which is dissolved in a solvent is prepared as a micro-phase separation structure-forming composition. Details of this micro-phase separation structure-forming composition will be explained hereinafter. The solution thus prepared is then coated on the opposite major surfaces of the transparent substrate 11 by a spin coating method. The resultant layer thus coated is then prebaked to vaporize the solvent to form a polymer layer 16 to be subsequently used as a mask as shown in FIG. 2A. Thereafter, the polymer layer 16 is subjected to annealing in a nitrogen gas atmosphere to take place the phase separation of the block copolymer.

Then, the polymer layer 16 where the phase separation of the block copolymer has been taken place is subjected to reactive ion etching (RIE) in the presence of etching gas flow. On this occasion, due to a difference in etching rate among a plurality of polymer fragments constituting the block polymer, any one of the polymer fragments is selectively etched away. As a result, a pattern (mask layer) 16a constituted by the residual polymer fragments is formed as shown in FIG. 2B.

Further, by using the pattern 16a of the polymer fragments as a mask, the transparent substrate 11 is subjected to RIE by using a fluorine-based etching gas to form a fine pattern constituted by recessed/projected portions on the surface of the transparent substrate 11. Then, the pattern 16a of the polymer fragments is removed by using an $O_2$ asher to obtain a transparent substrate 11a having fine recessed/projected portions as shown in FIG. 2C.

Alternately, the transparent substrate 11a having fine recessed/projected portions can be manufactured by imprint.

FIGS. 3A to 3F respectively shows a cross-sectional view illustrating in stepwise the method of manufacturing a transparent substrate for display device according to another embodiment of the present invention.

Figure 3A:
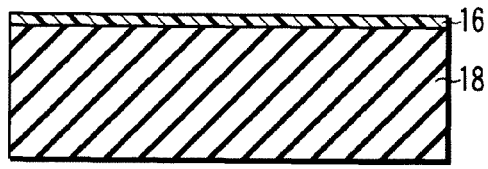
FIGS. 3A to 3F respectively shows a cross-sectional view illustrating in stepwise the method of manufacturing a transparent substrate for display device according to another embodiment of the present invention.

First of all, a solution comprising a block copolymer which is dissolved in a solvent is prepared as a micro-phase separation structure-forming composition. The solution thus prepared is then coated on an imprinting substrate 18 to be used as a master plate for imprint by a spin coating method. The resultant layer thus coated is then prebaked to vaporize the solvent to form a mask material layer 16 as shown in FIG. 3A. As for the imprinting substrate 18, it is possible to form it by using nickel, silicon, etc. for instance. Thereafter, the mask material layer 16 is subjected to annealing in a nitrogen gas atmosphere to take place the phase separation of the block copolymer.

Figure 3B:
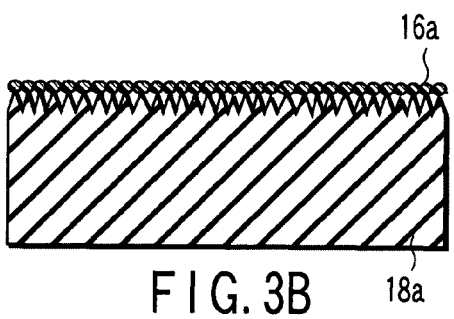

Then, the polymer layer 16 where the phase separation of the block copolymer has been taken place is subjected to reactive ion etching (RIE) in the presence of etching gas flow. On this occasion, due to a difference in etching rate among a plurality of polymer fragments constituting the block polymer, any one of the polymer fragments is selectively etched away. As a result, a pattern 16a constituted by the residual polymer fragments is formed as shown in FIG. 3B.

Thereafter, by using the pattern 16a of the polymer fragments as a mask, the imprinting substrate 18 is subjected to RIE by using a fluorine-based etching gas to form a fine pattern constituted by recessed/projected portions on the surface of the imprinting substrate 18. Then, the pattern 16a of the polymer fragments is removed by using an $O_2$ asher to obtain an imprinting master 18a having fine recessed/projected portions as shown in FIG. 3C.

Figure 3E:
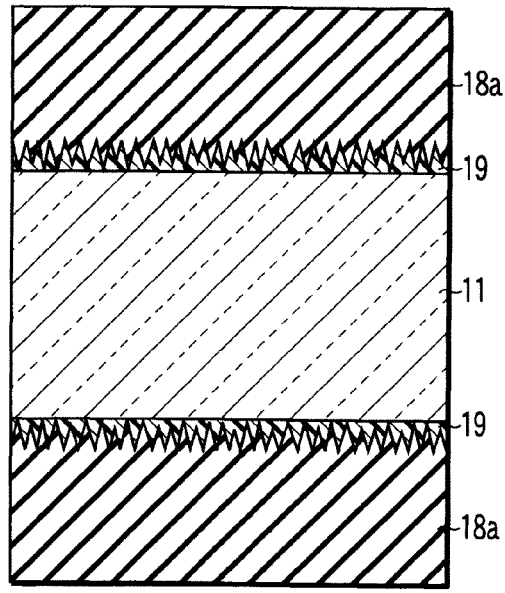
Figure 3C:
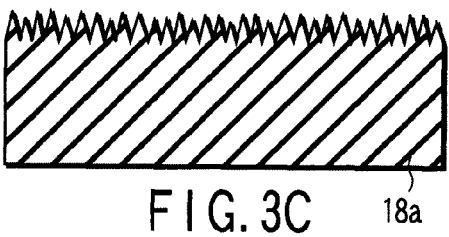
Figure 3F:
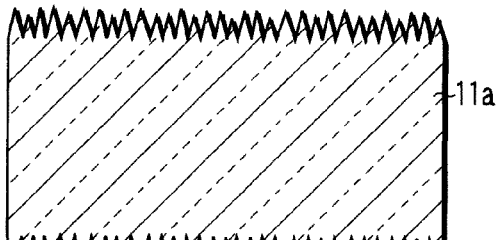
Figure 3D:
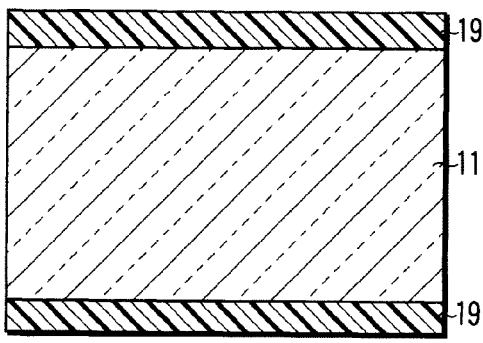

On the other hand, as shown in FIG. 3D, a polymer is coated on the opposite surfaces of the transparent substrate 11 and the resultant layers are prebaked to vaporize the solvent to form a polymer film 19. As for the polymer to be used in this case, it is possible to use methyl polymethacrylate (PMMA). Further, the thickness of the polymer film 19 may be optionally determined depending on the refractive index, etc., a preferable range of the thickness of the polymer film 19 being within the range of 200 to 500 nm or so.

The aforementioned imprinting master 18a is then pressed onto the polymer film 19 as shown in FIG. 3E. This step is performed in vacuum or at the ordinary pressure in a nitrogen atmosphere with the temperature being set to 50° C. higher than the glass transition temperature of the polymer film and the pressure being set to several tens MPa. As a result, the fine recessed/projected portions formed on the surface of the imprinting substrate 18a are transcribed on the surface of the polymer film 19.

Then, by using this pattern of fine recessed/projected portions as a mask, the transparent substrate 11 is subjected to RIE using a fluorine-based etching gas to form the pattern of fine recessed/projected portions on the surface of glass layer. The polymer film 19 left remained thereon is removed by using an $O_2$ asher to obtain the transparent substrate 11a having fine recessed/projected portions formed on the opposite surfaces thereof as shown in FIG. 3F.

Alternatively, it is possible, through the employment of the following pattern transfer technique, to form a pattern of fine recessed/projected portions having projected portions of high aspect ratio on the surface of the transparent substrate 11a.

FIGS. 4A to 4D respectively shows a cross-sectional view illustrating in stepwise the method of manufacturing a transparent substrate for display device according to another embodiment of the present invention.

Figure 4A:
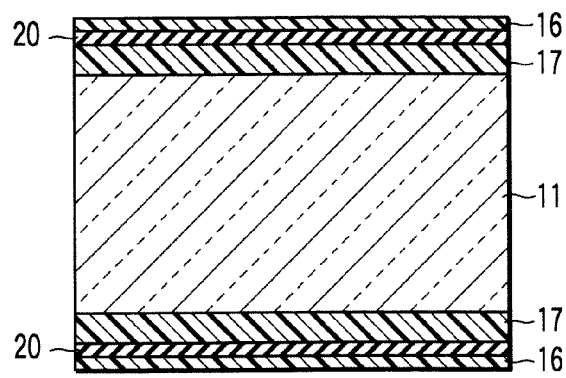
FIGS. 4A to 4D respectively shows a cross-sectional view illustrating in stepwise the method of manufacturing a transparent substrate for display device according to another embodiment of the present invention.

First of all, as shown in FIG. 4A, a mask material layer 16 is formed through a resist film 17 and an SOG (spin-on-glass) film 20 on the surface of the transparent substrate 11. This resist film 17 functions as a pattern transfer layer.

This pattern transfer layer is disposed below the mask material layer 16 and is used as a layer onto which the pattern formed in the mask material layer 16 is transcribed. The phase weaker in etching resistance among the polymer of the mask material layer 16 is etched away at first and then, the pattern transfer layer is etched away. Preferably, the thickness and etching rate of the pattern transfer layer should be set to such that the pattern transfer layer can be completely etched away before the phase exhibiting higher etching resistance among the mask material layer can be etched away. For example, the pattern transfer layer should preferably be such that the dry etching rate thereof is 0.1 or more, more preferably 1 or more, most preferably 2 or more as compared with that of the polymer exhibiting a higher dry etching rate among the block copolymer to be used as a mask material layer.

The pattern transfer layer can be formed by polysilane for example. As for the examples of polysilane, they include poly(methylphenyl silane), poly(diphenyl silane), poly(m- ethylchloromethylphenyl silane), etc. The polysilane may be either homopolymer or copolymer. Alternatively, two or more polysilane may be coupled with each other via oxygen atom, nitrogen atom, aliphatic group or aromatic group. It is also possible to use an organic silicon polymer where polysilane is copolymerized with a carbon-based polymer.

Although there is not any particular limitation with respect to the molecular weight of polysilane, the molecular weight thereof should be within the range of 2000 to 1000000, more preferably within the range of 3000 to 100000. If the molecular weight thereof is too small, the coating property or etching resistance of the polysilane film would be deteriorated. Moreover, if the molecular weight thereof is too small, the polysilane film may be redissolved on the occasion of forming an SOG film on the pattern transfer film, thereby generating the mixing between the SOG film and the polysilane film used as the pattern transfer film. On the other hand, if the molecular weight thereof is too high, the solubility of polysilane to a solvent would be deteriorated.

Incidentally, since polysilane is liable to be oxidized and hence the etching property thereof is liable to be varied, it is preferable to incorporate therein an anti-oxidant or photo-degradation preventing agent. Although there is not any particular limitation with respect to the mixing ratio of these agents, it is preferable to use these agents at a ratio ranging from 0.01 to 10 wt %, more preferably at a ratio ranging from 0.05 to 2 wt %. If this mixing ratio is too small, the effects to be derived from the addition of these agents would become meaningless. On the other hand, if this mixing ratio is too high, the etching property of the polysilane may be deteriorated.

Figure 4B:
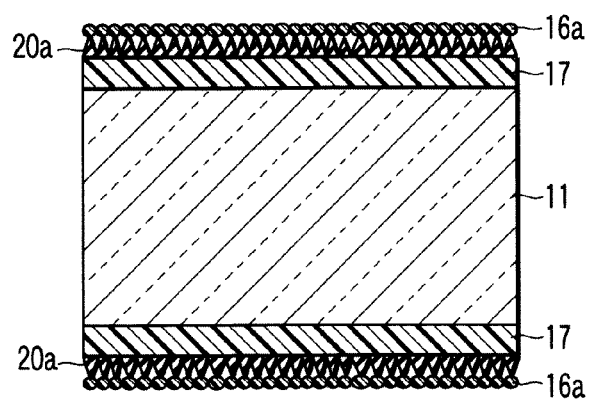

After the phase separation of the block copolymer included in the mask material layer 16 is caused to generate by the procedure as explained above, the mask material layer 16 is subjected to dry etching or wet etching to selectively remove only one of the phases of the block copolymer, thus forming a pattern 16a consisting of residual polymer fragments as shown in FIG. 4B. By using this pattern 16a of residual polymer fragments as a mask, the SOG layer 20 is subjected to etching to form an SOG pattern 20a.

Figure 4C:
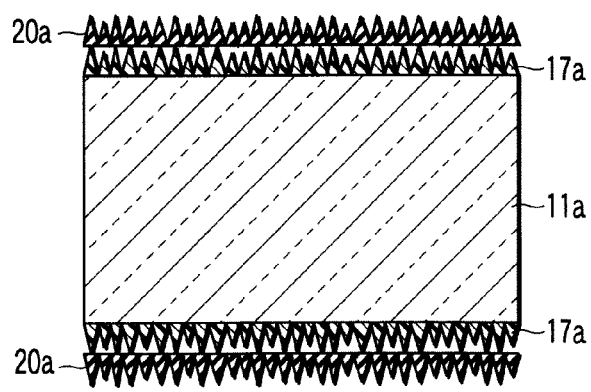

Further, by using this SOG layer 20 as a mask, the pattern transfer layer 17 is subjected to etching to form a pattern 17a as shown in FIG. 4C. It is possible in this manner to transcribe the micro-phase separated pattern of block copolymer onto the pattern transfer layer 17.

Figure 4D:
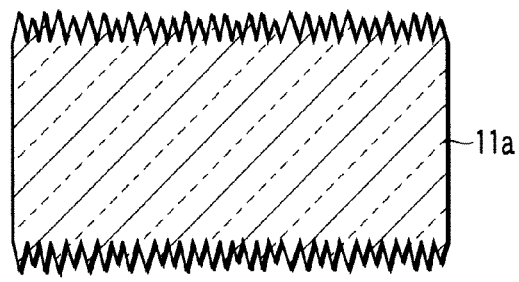

Then, by using the SOG pattern 20a and the patterned pattern transfer layer 17a as a mask, the transparent substrate 11 is subjected to etching, thereby obtaining the transparent substrate 11a having fine recessed/projected portions formed thereon as shown in FIG. 4D, the projected portions having high aspect ratio.

Thereafter, by vapor deposition method or sputtering method, a thin ITO film is deposited on the transparent substrate 11a having fine recessed/projected portions formed thereon, thereby forming the anode 12. Additionally, the hole injection layer 13, the light emitting layer 14 and the cathode 15 are successively formed by vapor deposition method, sputtering method or coating method to obtain the organic EL element as shown in FIG. 1. If required, an electron injection layer may be incorporated into a prescribed location of the layers.

The layers such as the electron injection layer, the hole injection layer and the light emitting layer may be formed by spin coating method or casting method. If these methods are to be employed, an organic material or an inorganic material is dissolved in a volatile solvent to prepare a raw material solution. Then, while rotating the transparent substrate having an anode formed thereon as required, the raw material solution is coated on the transparent substrate to form a coated layer, from which the solvent is subsequently evaporated to obtain a thin film.

No matter which methods are employed for forming the film, each of the layers can be caused to go through the hysteresis of the pattern of the fine recessed/projected portions of the surface of the transparent substrate on the occasion of forming the layers, it is possible to self-regulatively secure this pattern of the fine recessed/projected portions at each interface of the layers. In other words, since this pattern of the fine recessed/projected portions can be formed at an interface of the laminate structure, it is possible to minimize the reflection of light at the interface and hence to improve the transmittance of light. Moreover, since the outermost display side surface of display is also enabled to have this same pattern of the fine recessed/projected portions, it is also possible to achieve the anti reflection effect.

Next, the construction of a liquid crystal display device (LCD) according to other embodiment of the present invention will be explained.

Figure 5:
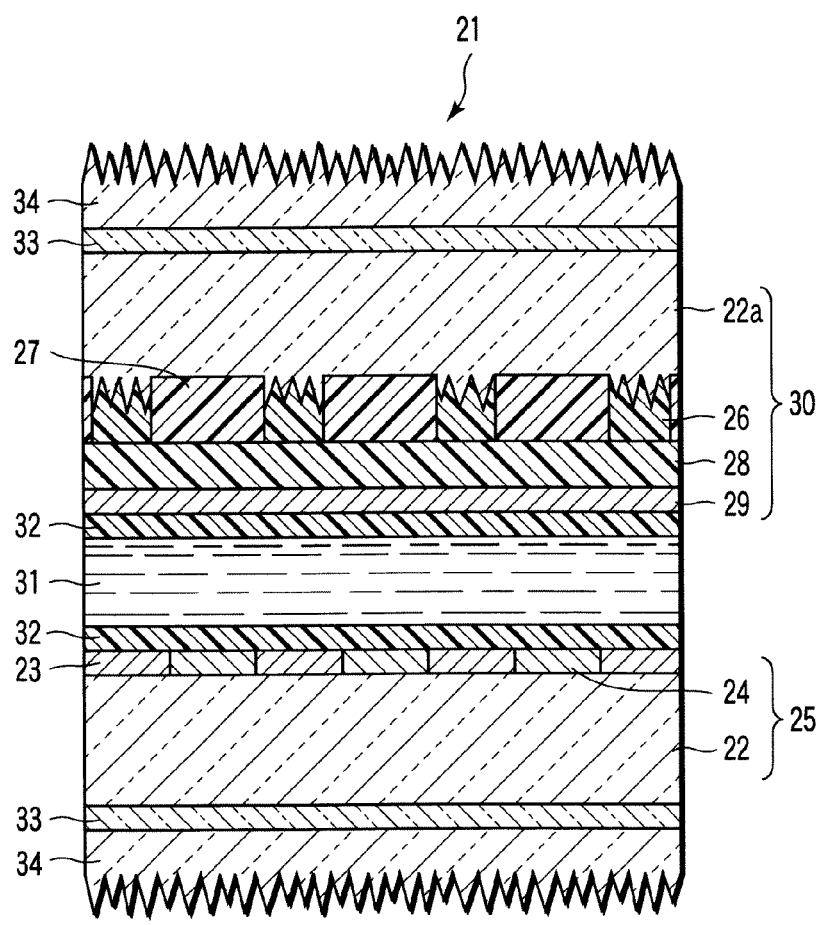
FIG. 5 is a cross-sectional view illustrating the structure of a liquid crystal display device according to one embodiment of the present invention.

FIG. 5 is a cross-sectional view illustrating the structure of a liquid crystal display device according to one embodiment of the present invention.

Referring to the LCD 21 shown therein, a liquid crystal layer 31 is sustained via a polyimide film 32 between a TFT substrate 25 and a color filter substrate 30. The TFT substrate 25 comprises a glass substrate 22 having a driving element (TFT) 23 and a transparent electrode (ITO) 24 formed thereon. The color filter substrate 30 comprises a glass substrate 22a on which a color filter 27 and a black matrix (BM) 26 as well as a protective film 28 and an ITO film 29 are successively formed.

On the surface of each of the glass substrates 22 and 22a, there is formed, through an adhesive layer 33, a polarizing plate 34.

In this color filter substrate 30, a pattern of fine recessed/projected portions is formed at an interface between the transparent substrate 22a and the BM 26. Furthermore, the same pattern as mentioned above is also formed on the polarizing plate 34 constituting the outermost surface of the color filter substrate 30.

The transparent substrate 22a having these fine recessed/projected portions on the surface thereof can be manufactured in the same manner as described above. On the other hand, the polarizing plate having these fine recessed/projected portions on the surface thereof can be manufactured by a process wherein these fine recessed/projected portions are formed on the surface of a protective film for a polarizer in the same manner as described above and then, the resultant protective film is adhered onto the polarizer to obtain the polarizing plate.

Figure 6A:
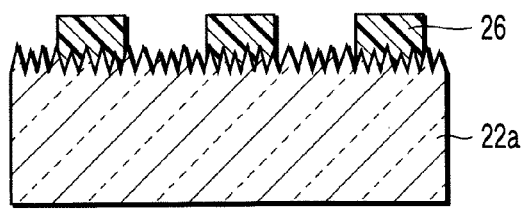
FIGS. 6A and 6B respectively shows a cross-sectional view illustrating in stepwise the method of manufacturing an LCD according to one embodiment of the present invention.
Figure 6B:
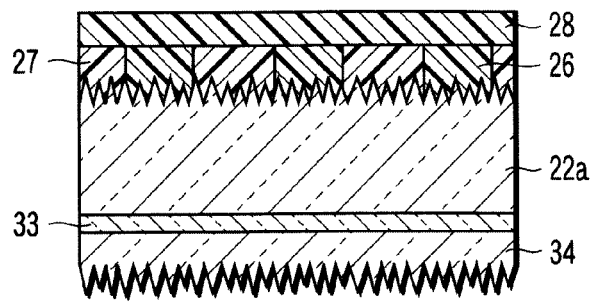

FIGS. 6A and 6B respectively shows a cross-sectional view illustrating in stepwise one example of the manufacturing method of an LCD according to a further embodiment of the present invention.

According to the same procedure as explained above, the transparent substrate 22a having these fine recessed/projected portions on the surface thereof is prepared in advance. Then, as shown in FIG. 6A, a layer of Cr, $Cr/CrO_x$, Mo or $Mo/MoO_x$ is formed on the transparent substrate 22a by a masked vapor deposition method or a lift-off method to form the BM layer 26. Since this BM layer 26 is formed while going through the hysteresis of the pattern of the fine recessed/projected portions formed on the surface of the transparent substrate 22a, it is possible to self-regulatively secure this same pattern at the interface between the transparent substrate 22a and the layer 26. The fine recessed/projected portions formed at the interface between the transparent substrate 22a and the layer 26 act to minimize the reflectance.

Thereafter, pigments of three primary colors, i.e. Red, Green and Blue (hereinafter referred to as RGB) are coated on the surface of the transparent substrate 22a and subjected to a patterning process to form the color filter 27. Then, as shown in FIG. 6B, the protective film 28 is formed on the color filter 27, and at the same time, the polarizing plate 34 prepared as described above is adhered via the adhesive layer 33 onto the opposite surface of the transparent substrate 22a. Due to the provision of these fine recessed/projected portions formed on the surface of the polarizing plate 34 constituting an outermost layer, the transmittance of light can be enhanced and at the same time, the reflectance of light can be further minimized.

Furthermore, the ITO electrode 29 is formed on the protective film 28 to accomplish the manufacture of the color filter substrate 30.

Thereafter, the liquid crystal layer 31 is sustained between the color filter substrate 30 manufactured as described above and the TFT substrate 25 having the driving element and the transparent electrode formed thereon, thus accomplishing the manufacture of the LCD shown in FIG. 5.

Next, the construction of a plasma display (PDP) according to the embodiment of the present invention will be explained.

Figure 7:
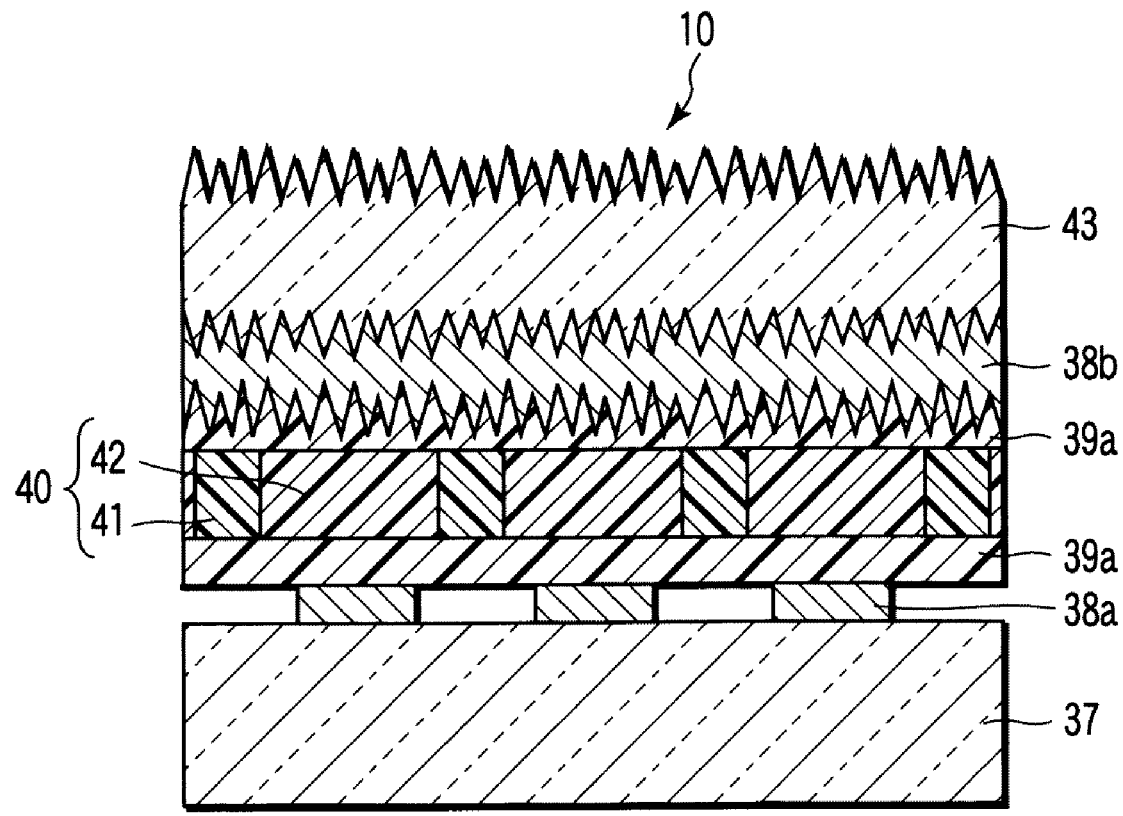
FIG. 7 is a cross-sectional view illustrating the structure of a PDP according to one embodiment of the present invention.

FIG. 7 is a cross-sectional view illustrating the structure of a PDP according to one embodiment of the present invention.

Referring to the PDP 36 shown therein, a discharge cell 40 sandwiched via protective films 39a and 39b between a pair of electrodes 38a and 38b is disposed over the transparent supporting substrate 37 formed of a glass substrate. This discharge cell 40 comprises a barrier 41 and a fluorescent body 42. A display side transparent substrate 43 formed of a glass substrate is disposed on the electrode 38b.

On each of the opposite major surfaces of the display side transparent substrate 43, there is formed the same kind of fine recessed/projected portions as explained above. This display side transparent substrate 43 having these fine recessed/projected portions can be manufactured in the same manner as already explained above.

A display electrode as well as a bus electrode are formed, through a procedure including printing, sputtering and exposure, on the surface of this display side transparent substrate 43. Additionally, an MgO layer is formed thereover by a vapor deposition method or a sputtering method, thereby forming the aforementioned fine recessed/projected portions self-regulatively at an interface, thus obtaining the PDP as shown in FIG. 7. Since these fine recessed/projected portions are formed at an interface of laminate structure, the reflectance at the interface can be minimized and at the same time, the transmittance of the laminate structure can be improved. Moreover, since the surface of the display side transparent substrate 43 is also provided with the same kind of fine recessed/projected portions, it is also possible to achieve the anti reflection effect.

Next, the features of the micro-phase separation structure-forming composition according to the present invention will be explained.

As described above, in the method according one embodiment of the present invention, a thin film of a block copolymer or a graft copolymer is formed at first and then, micro-phase separation (phase separation inside the molecule of block copolymer) is permitted to take place in the thin film. Thereafter, one of the polymer phases is selectively removed to form a porous film having a pattern of nanometer size. The porous film thus obtained can be used as a mask for transcribing the pattern of nanometer size to an underlying layer by etching.

The selective removal of one of the polymer phases from the micro-phase separation structure can be performed by taking advantage of a difference in dry etching rate, a difference in decomposing property to an energy ray, or a difference in thermal decomposing property. No which method is employed among these methods, it is not required to use lithography technique and therefore, throughput can be enhanced and manufacturing cost can be reduced.

First of all, the features of the block copolymer or graft copolymer will be explained. By the term "block copolymer", it means a linear copolymer wherein a plurality of homopolymer chains are linked as a block to each other. Examples of the block copolymer include an A-B type diblock copolymer having a structure of -(AA . . . AA)-(BB . . . BB)-, wherein an A-polymer chain having a repeated unit A and a B-polymer chain having a repeated unit B are linked to each other through the terminals thereof.

It is possible to use a block copolymer where three or more polymer chains are linked to each other. In the case of triblock copolymer, it may be any of A-B-A type, B-A-B type or A-B-C type. It is possible to use a star type block copolymer where one or plural kinds of polymer chains are radially extended from the center of the copolymer. The block copolymer may also be of $(A-B)_n$ type or $(A-B-A)_n$ type where four or more blocks are included therein.

On the other hand, the graft copolymer is formed of a structure where one or more different polymer chain are linked, as a side chain, to the main chain of a polymer. In the case of this graft copolymer, plural kinds of polymers may be suspended from the side chain. It is also possible to use a combination of a block copolymer and a graft copolymer wherein C polymer chain is suspended from a block copolymer such as an A-B type, A-B-A type or B-A-B type block copolymer.

It is more preferable to use the block copolymer, since it may become easier to obtain a polymer having a narrower molecular weight distribution and to control the ratio of composition as compared with the graft copolymer. Although specific examples of block copolymer will be explained hereinafter, the explanations on the block copolymers would be also applicable to graft copolymers as they are.

Block copolymers as well as graft copolymers can be synthesized by various polymerization methods, the most preferable method being living polymerization method. According to living anionic polymerization method or living cationic polymerization method, the polymerization of one monomer is initiated by the use of a polymerization initiator which is capable of generating anion or cation, and other monomer is sequentially added to the reaction mixture to synthesize the block copolymer. As for specific examples of monomer useful in this case, they include monomers having a double bond such as vinyl compounds and butadiene; cyclic ether monomers such as ethylene oxide; and cyclic oligosiloxane monomers.

Block copolymers as well as graft copolymers can be synthesized also by living radical polymerization method. In this living polymerization method, it is possible to precisely control the molecular weight thereof as well as the ratio in composition of copolymers, and hence to obtain a block copolymer where the molecular weight distribution thereof is relatively narrow. It is preferable, on the occasion of using the living polymerization method, to sufficiently dry the solvent with the use of a desiccating agent such as metal sodium and to prevent the contamination through the inclusion of oxygen by lyophilization or by using a method such as bubbling using an inert gas.

The polymerization reaction should preferably be performed under a pressurized condition, i.e. preferably 2 atm or more under an inert gas flow. The polymerization under a pressurized condition is advantageous in effectively preventing the contamination through the inclusion of water or oxygen from the outer atmosphere outside the reaction vessel or in carrying out the reaction process at a relatively low cost.

The chemical bond for linking polymer chains to each other should preferably be a covalent bond in terms of bonding strength, and in particular, carbon-carbon bond or carbon-silicon bond.

Since the synthesis of block copolymers as well as graft copolymers necessitates more sophisticated apparatus and skill as compared with ordinary radical polymerization method, the synthesis is usually performed in laboratory and the like. Further, in view of high cost involved therein, the industrial application thereof is very limited at present. However, in the fields where a product of added value is to be manufactured such as electronic industries, it is possible to secure a sufficient cost-performance even if block copolymers or graft copolymers are used.

According to Flory-Haggins theory, it is required, for the phase separation between the polymer A and the polymer B in general, that free energy AG of mixture should be positive. In a situation where the polymer A is not compatible with the polymer B and hence the repulsive force between a couple of polymer chains is strong, the phase separation would be more likely to take place. Further, since micro-phase separation is more likely to take place as the polymerization degree of block copolymer is increased, there is a lower limit with respect to the molecular weight of block copolymer.

However, the polymers constituting the phase separation structure are not necessarily required to be non-compatible with each other. As long as the precursor polymers of these polymers are mutually non-compatible with each other, it is possible to form a micro-phase separation structure. Namely, these precursor polymers can be converted into aimed polymers by the procedure wherein a phase separation structure is formed using these precursor polymers at first and then, the phase separation structure is heated, irradiated with light or added with a catalyst to take place the reaction thereof, thereby converting them into aimed polymers. As long as the reaction conditions are suitably selected on this occasion, there is no possibility that the phase separation structure that has been once formed by these precursor polymers is destroyed.

The phase separation would be most liable to take place when the composition ratio between the polymer A and the polymer B is set to 50:50. This means that the micro-phase structure which can be most easily formed is constituted by the lamellar structure. On the contrary, it is sometimes very difficult to form a sea-islet structure wherein the component of one of the polymers is greatly increased while the content of other polymer is minimized to form small islets therein. Therefore, it is very important on the occasion of forming a desirable micro-phase separation structure to suitably select the molecular weight of block copolymer.

In order to realize the patterning of a recessed/projected structure of nanometer size, a block copolymer having a larger molecular weight than that of the ordinary block copolymer is used in the embodiments of the present invention. Therefore, the block copolymer useful in this case should be within the range of 100,000 to 10,000,000 in number average molecular weight. If the molecular weight of the block copolymer is less than this lower limit, i.e. 100,000, it would be impossible to obtain a recessed/projected structure of desirable size. On the other hand, if the molecular weight of the block copolymer exceeds over 10,000,000, the viscosity of the block polymer would become excessively high so that it would be impossible to form the recessed/projected structure in a self-regulative manner, thus making it impossible to obtain a desirable pattern.

In the method according to the embodiments of the present invention, subsequent to the formation of self-regulating pattern, the substrate is worked by etching. In this case, it is difficult to form the self-regulating pattern wherein the height of individual pattern is larger than the horizontal length thereof. Therefore, if the molecular weight of block copolymer is too small and hence the self-regulating structure becomes too small, the thickness of the polymer film becomes smaller in proportion to the self-regulating structure. Therefore, where the pattern that can be self-regulated is relatively small, it is required to use an etching mask which is relatively small in thickness, thus inviting difficulties in the etching step. Therefore, it would be desirable to use a block copolymer having a molecular weight of larger than 400,000 for the purpose of facilitating the etching thereof. Further, since the polymer to be used in this case is generally synthesized by living anionic polymerization, the inclusion of water or oxygen is quite undesirable. However, water and oxygen are more or less included in the monomer in general, so that it is very difficult to completely remove water and oxygen. Due to this, it is considered very difficult to synthesize a polymer having a molecular weight of 3,000,000 or more. If the molecular weight of block copolymer is higher than 3,000,000, the viscosity of a solution of such a block copolymer would become very high and the concentration of the solvent cannot be sufficiently increased. As a result, non-uniformity of coating would appear on the occasion of coating and drying the solution.

As a matter of fact, it is very difficult to perform the polymerization of block copolymer with the molecular weight thereof being strictly controlled. Therefore, the component ratio of block copolymer may be adjusted in such a way that the molecular weight of a block copolymer that has been synthesized is measured at first, and then, a suitable quantity of one of the homopolymers constituting the block copolymer is blended to the block copolymer so as to obtain a desired composition of the block copolymer. The quantity of the homopolymer to be added thereto may be confined to not more than 100 parts by weight, preferably not more than 50 parts by weight, more preferably not more than 10 parts by weight per 100 parts by weight of the block copolymer. If the quantity of the homopolymer to be added becomes excessive, the micro-phase separation structure may be disturbed.

If the difference in solubility of two polymers constituting the block copolymer is too large, a phase separation may generate between block copolymer A-B and the homopolymer A. If such a phase separation is to be avoided as much as possible, the molecular weight of the homopolymer A should preferably be lowered. Because if the homopolymer A having a smaller molecular weight is blended thereto, the negative value of the term of entropy in Flory-Haggins formula would be enlarged, thus enabling the block copolymer A-B to be easily intermixed with the homopolymer A. Moreover, when the molecular weight of the homopolymer A is smaller than that of the block A of the block copolymer, the resultant composition would become more stable in thermodynamic viewpoint. When the thermodynamic stability is taken into account, the molecular weight of the homopolymer A should preferably be less than $2/3$ of the molecular weight of the block A of block copolymer. On the other hand, if the molecular weight of the homopolymer A is smaller than 1,000, it may be dissolved also into the polymer B of the block copolymer A-B and hence undesirable. Further, when the glass transition temperature is taken into account, the molecular weight of the homopolymer A should preferably be 3000 or more.

Next, specific examples of micro-phase separation structure-forming composition to be used in the embodiments of the present invention will be explained. This micro-phase separation structure-forming composition comprises a block copolymer or a graft copolymer each including at least two kinds of polymer chains exhibiting a large magnitude of difference in dry etching rate from each other. Specifically, the copolymers useful in this case include two kinds of polymer chains wherein the ratio in value of N/(Nc−No) (wherein N is a total number of atoms in the monomer unit; Nc is the number of carbon atom in the monomer unit; and No is the number of oxygen atom in the monomer unit) of the monomer unit is 1.4 or more. The fact that the ratio in value of N/(Nc−No) is not less than 1.4 in two kinds of polymer chains means that the selectivity ratio in the etching of these polymer chains constituting the micro-phase separation structure is relatively large. Namely, when a micro-phase separation structure-forming composition satisfying the aforementioned conditions is subjected to micro-phase separation and then dried, one of the polymer phases is selectively etched away, leaving behind the other polymer phase.

Next, the parameter of N/(Nc−No) will be explained in detail. N is a total number of atoms per segment (which corresponds to monomer unit) of polymer; Nc is the number of carbon atom per segment; and No is the number of oxygen atom per segment. This parameters is criteria indicating the dry etching resistance of polymer. The larger the this value is, the larger the etching rate would become in dry etching (i.e. dry etching resistance is deteriorated). Namely, the following relationship is existed between the etching rate ($V_{etch}$) and the aforementioned parameter:

$$V_{etch} \propto N/(Nc-No)$$

This trend is almost independent on the various etching gas such as Ar, $O_2$, $CF_4$, $H_2$, etc. (J. Electrochem. Soc., 130, 143 (1983)). As for the etching gas useful in this case, they include $C_2F_6$, $CHF_3$, $CH_2F_2$, $CF_3Br$, $N_2$, $NF_3$, $Cl_2$, $CCl_4$, HBr, $SF_6$, etc. other than Ar, $O_2$, $CF_4$, $H_2$. Incidentally, the aforementioned parameter is irrelevant to the etching of inorganic materials such as silicon, glass, metals, etc.

When specific value of the parameter is calculated, the following results would be obtained. Namely, in the case of polystyrene (PS), since the monomer unit thereof is $C_8H_8$, the etching rate would become: 16/(8−0)=2; in the case of polyisoprene (PI), since the monomer unit thereof is $C_5H_8$, the etching rate would become: 13/(5−0)=2.6; and in the case of methyl polymethacrylate (PMMA), since the monomer unit thereof is $C_5O_2H_8$, the etching rate would become: 15/(5−2)=5. Therefore, in the case of the block copolymer PS-PMMA, it can be expected that PS is high in etching resistance, and hence only PMMA can be easily etched off. For example, it has been confirmed that when reactive ion etching (RIE) is performed under the conditions of: 30 sccm in flow rate of $CF_4$, 1.33 Pa (0.01 Torr) in pressure, 150 W in progressive wave, and 30 W in reflected wave, the PMMA is etched at an etching rate which is several times faster than that of PS.

If aromatic ring is included in a molecule, the ratio of carbon atom is relatively increased due to the inclusion of double bond in the aromatic ring, so that the aforementioned parameter generally decreases. As clearly seen from the aforementioned parameter, the larger the number of carbon atom in a polymer is (i.e. the values of aforementioned parameter is relatively small), the higher the dry etching resistance thereof would become; and the larger the number of oxygen atom in a polymer is (i.e. the values of aforementioned parameter is relatively large), the lower the dry etching resistance thereof would become. This phenomenon can be explained qualitatively as follows. Carbon is not so reactive to radicals and hence is chemically stable. Therefore, if the number of carbon atom in a polymer is relatively large, the reactivity of polymer would become poor even if the polymer is attacked by various radicals, thus improving the etching resistance thereof.

Whereas, since oxygen atom is highly reactive to radicals, if the number of oxygen atom in a polymer is relatively large, the etching rate of the polymer would be accelerated, thus exhibiting poor etching resistance thereof. Furthermore, if oxygen is included in a polymer, oxygen radical generates therefrom, so that when a fluorine-based etching gas such as $CF_4$ is used, F radical proliferates due to the effect of oxygen radical, thereby increasing the number of F radical available for the etching and accelerating the etching rate. Since acrylic polymer includes a high ratio of oxygen atom and a small ratio of double bond therein, the value of the aforementioned parameter would be increased, thus rendering it vulnerable to etching.

As explained above, when the ratio of N/(Nc−No) parameter of the polymer A and the polymer B constituting the micropattern-forming material of the present invention is not less than 1.4, it is possible to obtain a clear pattern by etching. If this ratio is not less than 1.5, more preferably not less than 2, a difference in magnitude of etching rate between two kinds of polymers would be enlarged, thereby making it possible to enhance the stability on the occasion of working the material. The selectivity ratio on the occasion of etching two kinds of polymers in an actual dry etching process should preferably be 1.3 or more, more preferably not less than 2, most preferably not less than 3.

If $O_2$ is used as an etching gas for the purpose of enhancing the etching selectivity ratio, it is most preferable to use silicon-containing polymers as a polymer exhibiting a high etching resistance and to use halogen-containing polymers as a polymer exhibiting a low etching resistance. As for the silicon-containing polymers, it is possible to use poly(p-trimethylsilyl styrene) for instance. As for the halogen-containing polymers, it is possible to use halogen-containing acrylic polymers such as poly(chloroethyl methacrylate) for instance.

In the process of forming a thin film containing the aforementioned micro-phase separation structure-forming composition, it is preferable to coat a homogeneous solution of the aforementioned resin composition on the surface of glass substrate. By using a homogeneous solution, it is possible to prevent the hysteresis of a film-forming step from being left behind. When the coating solution is inhomogeneous due to the generation of micelle of relatively large particle size in the coating solution, it would become difficult to form a regular pattern due to the inclusion therein of non-regular phase separation structure or it would take relatively a long time for forming a regular pattern, and therefore, such an inhomogeneous coating solution is undesirable.

The solvent for dissolving the block copolymer to be used as a micro-phase separation structure-forming resin composition of the embodiment of the present invention should preferably be a good solvent for both of two kinds of polymers constituting the block copolymer. The repulsive force between these polymer chains is proportional to the square of a difference in solubility parameter between two kinds of polymer chains. Therefore, when a good solvent for both of two kinds of polymers is used, a difference in solubility parameter between two kinds of polymer chains would become smaller and hence the free energy of the system would become smaller, thus making it advantageous for the phase separation.

In order to make it possible to prepare a homogeneous solution on the occasion of manufacturing a thin film of a block copolymer, it is preferable to use a solvent having a high boiling point of not less than 150° C. such as ethyl Cellosolve acetate (ECA), propyleneglycol monomethylether acetate (PGMEA), ethyl lactate (EL), etc.

The film thickness of the thin film of a micro-phase separation structure-forming resin composition to be formed should preferably be twice or three times as large as the radius of each columnar portion of the recessed/projected surface. When this film thickness is not confined within this range, it may become difficult to obtain a recessed/projected structure each columnar portion thereof having a desired mean radius.

The micro-phase separation structure of a block copolymer or a graft copolymer can be manufactured by the following method. Namely, a block copolymer or a graft copolymer is dissolved in a suitable solvent to prepare a coating solution, which is then coated on a substrate and dried to form a film. This film is then annealed at a temperature which is equal to or higher than the glass transition temperature of the polymer, thus forming an excellent phase separation structure. Alternatively, the copolymer may be brought into a fused state and then, annealed at a temperature which is not lower than the glass transition temperature thereof and not higher than the phase transition temperature thereof, thereby enabling the micro-phase separation of the copolymer to take place, this micro-phase separation structure being subsequently kept at room temperature so as to be immobilized. It is also possible to form the micro-phase separation structure by slowly casting a solution of the copolymer onto a substrate. Alternatively, the micro-phase separation structure may be formed by a process wherein the copolymer is fused and then, molded into a layer of desired configuration by a suitable method such as a hot press molding method, an injection molding method, a transfer molding method, etc. the resultant layer being subsequently annealed to form the micro-phase separation structure.

Alternatively, the micro-phase separation structure can be formed by the following method.

First of all, two or more kinds of polymers which are incompatible to each other are dissolved in a suitable solvent to prepare a coating solution. Then, this coating solution is coated on the substrate and allowed to dry to form a thin film of multi-component/multi-phase type polymer. As for the coating method, it is possible to use a spin coating method, a dip coating method or a casting method.

Alternatively, a blend polymer may be fused and then, coated on the substrate. The resultant coated layer is then allowed to cool to form the micro-phase separation structure. Alternatively, plural kinds of polymers may be fused and molded into a layer of desired configuration by a suitable method such as a hot press molding method, an injection molding method, a transfer molding method, etc. the resultant layer being subsequently annealed by keeping it at a temperature which is equal to or higher than the glass transition temperature of the polymer material, thereby forming an excellent micro-phase separation structure.

Additives such as a dopant may be intermixed with the coating solution in the process of forming a coated layer. As for the additives, it is preferable to use those which are specifically high in affinity to one of the polymers which can be phase-separated from each other. In this case, the dopant can be easily segregated onto only one of the phases, which is high in affinity to the dopant on the occasion of forming the micro-phase separation structure.

As for the examples of such additives, they include, for example, metallic elements such as Cr, V, Nb, Ti, Al, Mo, Li, Lu, Rh, Pb, Pt, Au, etc. These metallic elements can be utilized as a growth nucleus for a magnetic film of a magnetic recording medium or as an electrode material of a cell. It is also possible to use additives which are capable of generating aforementioned metallic elements by the reduction of the additives. Specific examples of such additives include lithium 2,4-pentanedionate, lithium tetramethylpentanedionate, ruthenium 2,4-pentanedionate, magnesium 2,4-pentanedionate, magnesium hexafluoropentanedionate, magnesium trifluoropentanedionate, manganese(II) 2,4-pentanedionate, molybdenum(V) ethoxide, molybdenum(VI) oxide bis(2,4-pentanedionate), neodium 6,6,7,7,8,8,8-heptanefluoro-2,2-dimethyl-3,5-octanedionate, neodium hexafluoropentanedionate, neodium(III) 2,4-pentanedionate, nickel(II) 2,4-pentanedionate, niobium(V) n-butoxide, niobium(V) n-ethoxide, palladium hexafluoropentanedionate, palladium 2,4-pentanedionate, platinum hexafluoropentanedionate, platinum 2,4-pentanedionate, rhodium trifluoropentanedionate, ruthenium (III) 2,4-pentanedionate, tetrabutylammonium/hexachloroplatinate (IV), tetrabromogold(III) cetylpyridinium salt, etc.

The metals to be employed as an additive may be in the form of ion or formed of ultra-fine particles having a diameter of several nanometers to several tens nanometers which are specifically enhanced, through the surface treatment thereof, in affinity to one of the phases. For example, metallic fine particles whose surface is covered with the polymer A are enabled to segregate on the polymer A phase, while metallic fine particles whose surface is covered with the polymer B segregate on the polymer B phase. In this case, the surface-treated metallic fine particles precipitate at approximately the central portion of the phase exhibiting higher affinity among the phases constituting the phase separation structure of blend polymer. The metallic fine particles whose surface is covered with the block copolymer A-B segregate at the interface between the polymer A and the polymer B. It is possible, by using this method, to intentionally precipitate metal element onto a different kind of phase even if the same metal element is used. Even when the aforementioned ultra-fine particles are added to a coating solution, it is possible to segregate the ultra-fine particles onto only one of the phases which is higher in affinity to the particles.

The additives may not be simply intermixed with the coating solution but may be chemically bonded to the side chain or main chain of polymer. In this case, the additives can be easily segregated onto a specific phase by modifying only the polymer for forming a specific phase with a functional molecular structure. Alternatively, the additives may be introduced into polymer in such a way that a structure which is capable of easily bonding to a specific kind of additive is introduced into the main chain or side chain of polymer, and this structure is permitted to contact with the vapor or solution of the additive prior to or subsequent to the formation of the phase separation structure. For example, metallic ions can be introduced into the polymer by introducing in advance a chelate structure into the polymer. This chelate structure may be introduced into the main chain of the polymer or introduced as a substituent group into an ester site of polyacrylic ester. When a structure having ion exchanging property such as a pyridinium salt structure is introduced in advance into the polymer, metallic ions can be introduced, by counter-ion exchange, into the polymer.

It is possible, when a plasticizing agent is added to the micro-phase separation structure-forming material of the embodiment of the present invention, to form a micro-phase separation structure by a short period of annealing. Although there is not any particular limitation with respect to the quantity of the plasticizing agent to be added, it is preferable to confine the quantity of the plasticizing agent within the range of 1 to 70% by weight, more preferably 1 to 20% by weight, most preferably 2 to 10% by weight. If the quantity of the plasticizing agent to be added is too small, it would become impossible to obtain a sufficient effect to accelerate the formation of phase separation structure. On the other hand, if the quantity of the plasticizing agent to be added is too large, the regularity of the phase separation structure tends to be disturbed.

As for the plasticizer useful in this case, it is possible to use aromatic esters or aliphatic esters. For example, it is possible to use phthalic ester-based plasticizers such as dimethyl phthalate, dibutyl phthalate, di-2-ethylhexyl phthalate, dioctyl phthalate and diisononyl phthalate; trimellitic acid-based plasticizers such as octyl trimellitate; pyromellitic acid-based plasticizers such as octyl pyromellitate; and adipic acid-based plasticizers such as dibutoxyethyl adipate, dimethoxyethyl adipate, dibutyldiglycol adipate and dialkyleneglycol adipate.

As explained above, it is preferable, on the occasion of allowing the blend polymer to take place the phase separation thereof according to the embodiment of the present invention, to perform the annealing of the blend polymer at a temperature higher than the glass transition temperature of the blend polymer. However, when this heat treatment is performed in an atmosphere containing oxygen, the polymer may be denatured or degraded due to the oxidation reaction thereof, thereby making it impossible to form an excellent micro-phase separation structure, prolonging the time required for the heat treatment, or making it impossible to obtain desired etching selectivity ratio. In order to prevent the aforementioned degradation of the polymer, the heat treatment should preferably be performed under an oxygen-free condition, more preferably in dark room where the possibility of generating the photo-degradation can be minimized. However, the execution of annealing under an oxygen-free condition would necessitate a very strict control of the atmosphere, and therefore, it will lead to an increase of manufacturing cost.

In order to avoid such a problem, it is preferable to incorporate an antioxidant or a photo-degradation preventing agent into the blend polymer. Although there is not any particular limitation with respect to the kinds of the antioxidant and the photo-degradation preventing agent, it is preferable to use a radical trapping agent which is capable of trapping radical seeds that may be generated from the oxidation reaction or photo-degradation reaction of polymer.

More specifically, it is preferable to use a phenol-based antioxidant such as 3,5-di-tert-butyl-4-hydroxy toluene; a phosphorus-based antioxidant; sulfur-based antioxidant such as sulfide derivatives; HALS (Hindered Amine Light Stabilizer)-based photo-degradation preventive agent represented by piperidine-based compounds such as bis(2,2,6,6-tetramethylpiperidinyl-4) sebacate; and a metal complex-based photo-degradation preventive agent such as copper complex compounds and nickel complex compounds.

Although there is not any particular limitation with respect to the mixing ratio of these antioxidant and photo-degradation preventing agent, the mixing ratio should preferably be confined within the range of 0.01 to 10% by weight, more preferably 0.05 to 1% by weight, most preferably 0.1 to 0.5% by weight based on the blend polymer. If the quantity of these agents to be added is too small, it would become impossible to obtain a sufficient degree of oxidation-preventing effect or photo-degradation-preventing effect. On the other hand, if the quantity of these agents to be added is too large, the regularity of the phase separation structure tends to be disturbed.

Further, a crosslinking agent may be added to the blend polymer or a crosslinking group may be introduced into the blond polymer, thereby enabling the polymer to be mutually and three-dimensionally crosslinked after forming the phase separation structure. When such a crosslinking agent is incorporated into the polymer, the thermal or mechanical strength of the phase separation structure can be further improved, thereby enhancing the stability of the polymer. When the durability of the phase separation structure such as thermal resistance thereof is taken into account, the polymer phases constituting the phase separation structure should inherently be non-compatible with each other. However, even if the phase separation structure is constituted by phases which are not non-compatible with each other, the durability of the phase separation structure can be improved through a mutual crosslinking of the polymers constituting these phases.

Next, the present invention will be further explained with reference to the examples thereof. In order to demonstrate the effects of gradient index, a pattern of fine recessed/projected portions is formed on the surface or at the interface of an organic EL element in the cases of Examples 1 to 10, of an LCD in the cases of Examples 11 to 16, and of a PDP in the cases of Examples 17 to 20, and then, the luminescence and reflectance of these devices were evaluated.

In the cases of Examples 1 to 10, in order to demonstrate the effects of the gradient index, a pattern of fine recessed/projected portions is formed only on the top surface of the organic EL element and then, the brightness thereof was evaluated. In the case of Example 11, a pattern of fine recessed/projected portions is formed not only on the outermost surface of the device but also at the interface between layers and then, the luminescence thereof was evaluated.

Example 1

First of all, a block copolymer comprising polystyrene (PS) and methyl polymethacrylate (PMMA) was dissolved in propylene glycol monomethyl ether acetate (PGMEA) used as a solvent to prepare a solution of polymer. The molecular weight of the PS included in the block copolymer was 154800 and the molecular weight of the PMMA included therein was 392300, Mw/Mn of the block copolymer being 1.08.

This solution of polymer was then coated on the surface of a flat glass substrate by spin coating method at a rotational speed of 2500 rpm to form a coated film. This coated film was then prebaked at a temperature of 110° C. for 90 seconds to vaporize the solvent, thus forming a polymer layer having a thickness of 100 nm.

Then, the polymer layer was annealed at a temperature of 210° C. for 4 hours in a nitrogen gas atmosphere to phase-separate the PS from the PMMA in the block copolymer. Further, under the conditions of: 30 sccm in flow rate of $CF_4$, 1.33 Pa (10 mTorr) in pressure and 100 W in electric power, the polymer layer was dry-etched by RIE. Due to a difference in etching rate between the PS and the PMMA, the PMMA was selectively etched away to form a mask layer consisting a pattern of the PS.

By using this mask layer, the surface of the glass substrate was subjected to RIE for about 60 seconds under the same conditions as described above. As a result, a fine pattern was transcribed onto the surface of the glass substrate. The pattern of the PS left remained was removed by using an $O_2$ asher.

As a result, it was possible to form fine recessed/projected portions on the surface of the glass substrate, wherein the projected portions thereof were featured in that the diameter thereof was about 70 nm and the standard deviation thereof was 15% of a mean circle-equivalent diameter, that the height thereof was about 80 nm and the standard deviation thereof was 20% of mean height, that the circularity coefficient thereof was 0.8, and that the area ratio thereof was 0.4.

By sputtering method, an ITO thin film having a thickness of 150 nm was formed on the opposite surface of the glass substrate having these fine recessed/projected portions formed thereon to form an anode. Then, by vapor deposition method, a layer consisting of N,N'-diphenyl-N,N'-bis(3-methylphenyl)1-1'-bipheyl-4,4'-diamine (hereinafter referred to as TPD) and having a thickness of 100 nm was formed as the hole injection layer on the anode. Furthermore, by vapor deposition method, tris-(8-hydroxyquinoline)aluminum (hereinafter referred to as Alq3) was formed as a light-emitting layer on the hole injection layer.

Finally, by vapor deposition method, an Mg:Ag (5%) electrode was deposited to a thickness of 150 nm to obtain the organic EL element according this embodiment. The light-emitting wavelength of this element was 550 nm.

On the other hand, an organic EL element was manufactured as a comparative example in the same manner as described above except that a glass substrate not provided with the aforementioned fine recessed/projected portions was used. It was found, through the comparison with the organic EL element of this comparative example, that the organic EL element of Example 1 was 10% higher in luminescence in the average of 10 samples than that of the comparative example.

Example 2

In the same manner as described in Example 1, a polymer film comprising a PS-PMMA block copolymer was formed on a flat glass substrate and annealed to annealing to phase-separate the PS from the PMMA. Then, PS and PMMA were subjected to etching by RIE under the conditions of: 30 sccm in flow rate Of $O_2$, 13.3 Pa (100 mTorr) in pressure and 100 W in electric power. In contrast to the case where $CF_4$ was used as an etching gas, the use of $O_2$ gas as an etching gas was ineffective in etching the substrate. However, due to the use of $O_2$ gas, the PMMA was selectively etched, thus enabling the formation of a mask layer consisting of a pattern of the PS.

By using this mask layer, the surface of the glass substrate was dry-etched by RIE in the same manner as described in Example 1. As a result, it was possible to form fine recessed/projected portions on the surface of the glass substrate, wherein the projected portions thereof were featured in that the diameter thereof was about 70 nm and the standard deviation thereof was 15% of a mean circle-equivalent diameter, that the height thereof was about 100 nm and the standard deviation thereof was 20% of mean height, that the circularity coefficient thereof was 0.8, and that the area ratio thereof was 0.4.

In the same manner as described in Example 1, an anode, a hole injection layer, a light-emitting layer and a cathode were formed on the other surface of the glass substrate, i.e. the surface which was opposite to one where the aforementioned fine recessed/projected portions were formed, thereby obtaining the organic EL element of Example 2. The light-emitting wavelength of this element was 510 nm.

It was found, through the comparison with the organic EL element of the aforementioned comparative example, that the organic EL element of Example 2 was 15% higher in luminescence in the average of 10 samples than that of the comparative example.

Example 3

First of all, by using a block copolymer comprising PS and PMMA was dissolved in PGMEA used as a solvent to prepare a solution of polymer. The molecular weight of the PS included in the block copolymer was 315000 and the molecular weight of the PMMA included therein was 785000, Mw/Mn of the block copolymer being 1.08.

This solution of polymer was then coated on the surface of a flat glass substrate by spin coating method at a rotational speed of 3000 rpm to form a coated film. This coated film was then prebaked at a temperature of 110° C. for 90 seconds to vaporize the solvent, thus forming a polymer layer having a thickness of 150 nm.

Then, the polymer layer was annealed at a temperature of 210° C. for 4 hours in a nitrogen gas atmosphere to phase-separate the PS from the PMMA in the block copolymer. Further, under the conditions of: 30 sccm in flow rate Of $O_2$, 13.3 Pa (100 mTorr) in pressure and 100 W in electric power, the polymer layer was dry-etched by RIE. Due to a difference in etching rate (i.e. 1:4) between the PS and the PMMA, the PMMA was selectively etched to form a mask layer consisting a pattern of the PS and having a thickness of about 130 nm.

By using this mask layer, the surface of the glass substrate was subjected to RIE for two minutes under the conditions of: 30 sccm in flow rate of $CF_4$, 1.33 Pa (10 mTorr) in pressure and 100 W in electric power. As a result, a fine pattern having a width of 100 nm and a height of 200 nm was formed on the surface of the glass substrate. The pattern of the PS left remained was then removed by using an $O_2$ asher.

As a result, it was possible to form fine recessed/projected portions on the surface of the glass substrate, wherein the projected portions thereof were featured in that the diameter thereof was about 110 nm and the standard deviation thereof was 18% of a mean circle-equivalent diameter, that the height thereof was about 200 nm and the standard deviation thereof was 25% of mean height, that the circularity coefficient thereof was 0.85, and that the area ratio thereof was 0.45.

In the same manner as described in Example 1, an anode, a hole injection layer, a light-emitting layer and a cathode were formed on the other surface of the glass substrate, i.e. the surface which was opposite to one where the aforementioned fine recessed/projected portions were formed, thereby obtaining the organic EL element of Example 3. The light-emitting wavelength of this element was 510 nm.

It was found, through the comparison with the organic EL element of the aforementioned comparative example, that the organic EL element of Example 3 was 30% higher in luminescence in the average of 10 samples than that of the comparative example.

Example 4

In the same manner as described in Example 3, a polymer film comprising a PS-PMMA block copolymer was formed on a flat glass substrate and was annealed to phase-separate the PS from the PMMA. Then, PS and PMMA were subjected to etching by RIE under the conditions of: 30 sccm in flow rate of $CF_4$, 1.33 Pa (10 mTorr) in pressure and 100 W in electric power. Due to a difference in etching rate between the PS and the PMMA, the PMMA was selectively etched to form a mask layer consisting a pattern of the PS.

By using this mask layer, the surface of the glass substrate was dry-etched by RIE in the same manner as described in Example 3. As a result, it was possible to form fine recessed/projected portions on the surface of the glass substrate, wherein the projected portions thereof were featured in that the diameter thereof was about 110 nm and the standard deviation thereof was 20% of a mean circle-equivalent diameter, that the height thereof was about 160 nm and the standard deviation thereof was 20% of mean height, that the circularity coefficient thereof was 0.85, and that the area ratio thereof was 0.4.

Since $CF_4$ was used as an etching gas for RIE in this process, it was possible to concurrently perform the removal of the PMMA and the formation of the fine recessed/projected portions on the surface of glass substrate.

In the same manner as described in Example 1, an anode, a hole injection layer, a light-emitting layer and a cathode were formed on the other surface of the glass substrate, i.e. the surface which was opposite to one where the aforementioned fine recessed/projected portions were formed, thereby obtaining the organic EL element of Example 4. The light-emitting wavelength of this element was 510 nm.

It was found, through the comparison with the organic EL element of the aforementioned comparative example, that the organic EL element of Example 4 was 25% higher in luminescence in the average of 10 samples than that of the comparative example.

Example 5

In the same manner as described in Example 3, a mask layer consisting of a pattern of the PS and having a thickness of about 130 nm was formed on a flat glass substrate.

By using this mask layer, the surface of the glass substrate was dry-etched by RIE for two minutes under the conditions of: 30 sccm in flow rate of $C_4F_8$, 1.33 Pa (10 mTorr) in pressure and 100 W in electric power. As a result, a fine pattern having a width of 100 nm and a height of 300 nm was formed on the surface of the glass substrate. The pattern of the PS left remained was then removed by using an $O_2$ asher.

As a result, it was possible to form fine recessed/projected portions on the surface of the glass substrate, wherein the projected portions thereof were featured in that the diameter thereof was about 110 nm and the standard deviation thereof was 22% of a mean circle-equivalent diameter, that the height thereof was 300 nm and the standard deviation thereof was 27% of mean height, that the circularity coefficient thereof was 0.85, and that the area ratio thereof was 0.45. Due to the use of $C_4F_8$ containing a larger number of fluorine atom as compared with $CF_4$, it was possible to obtain a larger selectivity ratio on the occasion of etching and to form recessed/projected portions having an increased height.

In the same manner as described in Example 1, an anode, a hole injection layer, a light-emitting layer and a cathode were formed on the other surface of the glass substrate, i.e. the surface which was opposite to one where the aforementioned fine recessed/projected portions were formed, thereby obtaining the organic EL element of Example 5. The light-emitting wavelength of this element was 510 nm.

It was found, through the comparison with the organic EL element of the aforementioned comparative example, that the organic EL element of Example 5 was 50% higher in luminescence in the average of 10 samples than that of the comparative example.

Example 6

In the same manner as described in Example 1, a polymer film comprising a PS-PMMA block copolymer was formed on a flat glass substrate and was annealed to annealing to phase-separate the PS from the PMMA. Then, electron beam in the output power of 2 MeV in output was irradiated the entire top surface of the glass substrate to cut out the main chain of the PMMA. Then, by using a developing solution (a mixed solution consisting of methylisobutyl ketone-isopropyl alcohol), the polymer film was developed. Thereafter, the resultant surface was rinsed with isopropyl alcohol to selectively remove the PMMA, thus forming a mask layer consisting of a pattern of the PS. Then, the resultant surface was wet-etched by hydrofluoric acid.

As a result, it was possible to form fine recessed/projected portions on the surface of the glass substrate, wherein the projected portions thereof were featured in that the diameter thereof was about 80 nm and the standard deviation thereof was 18% of a mean circle-equivalent diameter, that the height thereof was 80 nm and the standard deviation thereof was 17% of mean height, that the circularity coefficient thereof was 0.85, and that the area ratio thereof was 0.4.

Then, in the same manner as described in Example 1, an anode, a hole injection layer, a light-emitting layer and a cathode were formed on the other surface of the glass substrate, i.e. the surface which was opposite to one where the aforementioned fine recessed/projected portions were formed, thereby obtaining the organic EL element of Example 6. The light-emitting wavelength of this element was 510 nm.

It was found, through the comparison with the organic EL element of the aforementioned comparative example, that the organic EL element of Example 6 was about 7% higher in luminescence in the average of 10 samples than that of the comparative example. It was demonstrated through this example 6 that even if a wet process was used, it was possible to achieve a sufficient effect.

Example 7

First of all, a block copolymer comprising polystyrene (PS) and polyisoprene (PI) was dissolved in PGMEA used as a solvent to prepare a solution of polymer. The molecular weight of the PS included in the block copolymer was 450000 and the molecular weight of the PI included therein was 1230000, Mw/Mn of the block copolymer being 1.07.

In the same manner as described in Example 3 except that this solution of polymer was used, a polymer film comprising a PS-PI block copolymer was formed on a flat glass substrate and was annealed to phase-separate the PS from the PMMA. Then, the PI was selectively removed from the phase-separated PS-PI block copolymer by ozone oxidation thereof, thus forming a mask layer consisting of a pattern of the PS.

Then, by using this mask layer, the polymer layer was dry-etched by RIE under the conditions of: 30 sccm in flow rate of $CF_4$, 1.33 Pa (10 mTorr) in pressure and 100 W in electric power to form a fine pattern. The pattern of the PS left remained was removed by using an $O_2$ asher.

As a result, it was possible to form fine recessed/projected portions on the surface of the glass substrate, wherein the projected portions thereof were featured in that the diameter thereof was about 140 nm and the standard deviation thereof was 27% of a mean circle-equivalent diameter, that the height thereof was about 220 nm and the standard deviation thereof was 30% of mean height, that the circularity coefficient thereof was 0.85, and that the area ratio thereof was 0.45.

Then, in the same manner as described in Example 1, an anode, a hole injection layer, a light-emitting layer and a cathode were formed on the other surface of the glass substrate, i.e. the surface which was opposite to one where the aforementioned fine recessed/projected portions were formed, thereby obtaining the organic EL element of Example 7. The light-emitting wavelength of this element was 510 nm.

It was found, through the comparison with the organic EL element of the aforementioned comparative example, that the organic EL element of Example 7 was about 45% higher in luminescence in the average of 10 samples than that of the comparative example.

Since the monomer of the PI is poor in water absorption, the block copolymer used in this example is prone to polymerize those having a higher molecular weight than the PMMA in the polymerization. As a result, it is possible to easily enlarge the size of the pattern.

The thickness of the polymer film should be selected corresponding to the magnitude in size of the pattern to be created by using the block copolymer. Therefore, if the pattern to be created by the block copolymer is larger in size, the height of the pattern to be transferred onto the glass substrate can be increased. Almost the same structure as described above was obtained even when polybutadiene (PB) was substituted for the PI.

Example 8

As an imprinting substrate, an Si substrate having an $SiO_2$ film formed on the top surface thereof was prepared.

Then, in the same manner as described in Example 3, a mask layer consisting of a pattern of the PS and having a thickness of about 130 nm was formed on the surface of this imprinting substrate.

By using this mask layer, the surface of the imprinting substrate was dry-etched by RIE for 90 seconds under the conditions of: 30 sccm in flow rate of $CF_4$, 1.33 Pa (10 mTorr) in pressure and 100 W in electric power, thereby a fine pattern on the surface of the imprinting substrate. The pattern of the PS left remained was then removed by using an $O_2$ asher.

As a result, it was possible to form fine recessed/projected portions on the surface of the glass substrate, wherein the projected portions thereof were featured in that the diameter thereof was about 100 nm and the standard deviation thereof was 20% of a mean circle-equivalent diameter, that the height thereof was 150 nm and the standard deviation thereof was 18% of mean height, that the circularity coefficient thereof was 0.85, and that the area ratio thereof was 0.45.

On the other hand, a solution of PMMA (molecular weight: 15000) was coated on a glass substrate for organic EL element and then, prebaked to form a PMMA film having a thickness of 200 nm. Thereafter, the aforementioned imprinting master was pressed into this PMMA film in vacuum for 30 minutes at a temperature of 180° C. and a pressure of 10 MPa. As a result, it was possible to form a pattern of PMMA having fine and columnar recessed/projected portions, wherein the columnar projected portions thereof were featured in that the diameter thereof was 100 nm and the standard deviation thereof was 20% of a mean circle-equivalent diameter, that the height thereof was 150 nm and the standard deviation thereof was 18% of mean height, that the circularity coefficient thereof was 0.85, and that the area ratio thereof was 0.55.

Then, by using this pattern of PMMA as a mask, the polymer layer was dry-etched by RIE for three minutes under the conditions of: 30 sccm in flow rate of $CF_4$, 1.33 Pa (10 mTorr) in pressure and 100 W in electric power.

As a result, it was possible to form fine recessed/projected portions on the surface of the glass substrate, wherein the projected portions thereof were featured in that the diameter thereof was about 110 nm and the standard deviation thereof was 20% of a mean circle-equivalent diameter, that the height thereof was about 250 nm and the standard deviation thereof was 25% of mean height, that the circularity coefficient thereof was 0.85, and that the area ratio thereof was 0.55.

Then, in the same manner as described in Example 1, an anode, a hole injection layer, a light-emitting layer and a cathode were formed on the other surface of the glass substrate, i.e. the surface which was opposite to one where the aforementioned fine recessed/projected portions were formed, thereby obtaining the organic EL element of Example 8. The light-emitting wavelength of this element was 510 nm.

It was found, through the comparison with the organic EL element of the aforementioned comparative example, that the organic EL element of Example 8 was 60% higher in luminescence in the average of 10 samples than that of the comparative example.

Example 9

A resist was coated on a flat glass substrate and prebaked at a temperature of 110° C. to form a coated film having a thickness of 350 nm. This coated film was then baked for one minute at a temperature of 300° C. to obtain a resist film, on which SOG (OCD T-7 (trademark); Tokyo Ohka Co., Ltd.) was spin-coated to obtain a coated film having a thickness of 110 nm. This coated film was then baked over a hot plate at a temperature of 200° C. for 60 seconds and then, at a temperature of 300° C. for 60 seconds to form a laminate film comprising a resist film and an SOG film.

The same polymer solution as that of Example 3 was coated on the SOG film by spin coating method at a rotational speed of 2500 rpm to form a coated film. This coated film was then prebaked at a temperature of 110° C. for 90 seconds to vaporize the solvent, thus forming a polymer film.

Then, the polymer film was annealed at a temperature of 210° C. for 4 hours in a nitrogen gas atmosphere to phase-separate the PS from the PMMA in the block copolymer. Further, under the conditions of: 30 sccm in flow rate Of $O_2$, 13.3 Pa (100 mTorr) in pressure and 100 W in electric power, the PS and PMMA of the phase-separated film was dry-etched by RIE. Due to a difference in etching rate between the PS and the PMMA, the PMMA was selectively etched away to form a mask layer consisting a pattern of the PS.

By using this mask layer, the SOG film was dry-etched by RIE under the conditions of: 30 sccm in flow rate of $CF_4$, 1.33 Pa (10 mTorr) in pressure and 100 W in electric power. Additionally, the resist layer was dry-etched by RIE under the conditions of: 30 sccm in flow rate Of $O_2$, 13.3 Pa (100 mTorr) in pressure and 100 W in electric power, thereby etching the lower resist film and obtaining a columnar fine pattern having a height of 450 nm.

Then, the polymer film was dry-etched under the conditions of: 30 sccm in flow rate of $CF_4$, 1.33 Pa (10 mTorr) in pressure and 100 W in electric power. Finally, the polymer film was dry-etched using oxygen gas to remove the polymer film. Incidentally, the SOG film was already etched in the previous etching process using $CF_4$ and hence there was no problem with respect to the removal of the SOG film.

As a result, it was possible to perform a deep etching and it was possible, through this etching, to form fine recessed/ projected portions on the surface of the glass substrate, wherein the projected portions thereof were featured in that the diameter thereof was about 120 nm and the standard deviation thereof was 30% of a mean circle-equivalent diameter, that the height thereof was about 300 nm and the standard deviation thereof was 35% of mean height, that the circularity coefficient thereof was 0.85, and that the area ratio thereof was 0.5.

Then, in the same manner as described in Example 1, an anode, a hole injection layer, a light-emitting layer and a cathode were formed on the other surface of the glass substrate, i.e. the surface which was opposite to one where the aforementioned fine recessed/projected portions were formed, thereby obtaining the organic EL element of Example 9. The light-emitting wavelength of this element was 510 nm.

It was found, through the comparison with the organic EL element of the aforementioned comparative example, that the organic EL element of Example 9 was 65% higher in luminescence in the average of 10 samples than that of the comparative example.

Example 10

An aluminum film having a thickness of 30 nm was formed on a flat glass substrate by a vapor deposition method. Then, the same polymer solution used in Example 3 was coated on the aluminum film by spin coating method at a rotational speed of 2500 rpm and prebaked at a temperature of 110° C. for 90 seconds to evaporate the solvent, thus forming a polymer film.

Then, the polymer film was annealed at a temperature of 210° C. for 4 hours in a nitrogen gas atmosphere to phase-separate the PS from the PMMA in the block copolymer. Further, under the conditions of: 30 sccm in flow rate Of $O_2$, 13.3 Pa (100 mTorr) in pressure and 100 W in electric power, the PS and PMMA of the phase-separated film was subjected to RIE to form a pattern of the PS.

Then, by using a mixed solution acting as an etchant for aluminum and containing: potassium hydroxide:potassium ferricyanide:water (=1:6:1000), the surface of the glass substrate was wet-etched for one minute. As a result, it was possible to form a dot pattern consisting of the PS+aluminum. Since the etching rate of aluminum was very slow in the RIE using $CF_4$, it was possible to advantageously enlarge the selectivity ratio between aluminum and glass.

Finally, the surface of the glass substrate was dry-etched for 10 minutes under the conditions of: 30 sccm in flow rate of $CF_4$, 1.33 Pa (10 mTorr) in pressure and 100 W in electric power. Incidentally, the PS and aluminum film were completely etched away in the etching process using $CF_4$ and hence there was no problem with respect to the removal of the PS and aluminum film.

As a result, it was possible to perform a deep etching and it was possible, through this etching, to form fine recessed/projected portions on the surface of the glass substrate, wherein the projected portions thereof were featured in that the diameter thereof was about 120 nm and the standard deviation thereof was 35% of a mean circle-equivalent diameter, that the height thereof was about 400 nm and the standard deviation thereof was 35% of mean height, that the circularity coefficient thereof was 0.85, and that the area ratio thereof was 0.4.

Then, in the same manner as described in Example 1, an anode, a hole injection layer, a light-emitting layer and a cathode were formed on the other surface of the glass substrate, i.e. the surface which was opposite to one where the aforementioned fine recessed/projected portions were formed, thereby obtaining the organic EL element of Example 10. The light-emitting wavelength of this element was 510 nm.

It was found, through the comparison with the organic EL element of the aforementioned comparative example, that the organic EL element of Example 10 was 70% higher in luminescence in the average of 10 samples than that of the comparative example.

Example 11

In this example, the aforementioned fine recessed/projected portions were formed on not only one of the major surfaces of a glass substrate but also at each of the interfaces of a laminated structure.

First of all, by using the same procedure as used in Example 3, a mask layer was formed on the opposite major surfaces of a flat glass substrate. Then, by using this mask layer, the surfaces of the glass substrate were dry-etched under the same conditions as used in Example 3 to form fine recessed/projected portions on the opposite surfaces of the glass substrate, wherein the projected portions thereof were featured in that the diameter thereof was about 110 nm and the standard deviation thereof was 18% of a mean circle-equivalent diameter, that the height thereof was about 200 nm and the standard deviation thereof was 25% of mean height, that the circularity coefficient thereof was 0.85, and that the area ratio thereof was 0.45.

Then, in the same manner as described in Example 1, an anode, a hole injection layer, a light-emitting layer and a cathode were formed on the other surface of the glass substrate, i.e. the surface which was opposite to one where the aforementioned fine recessed/projected portions were formed, thereby obtaining the organic EL element of Example 11. The light-emitting wavelength of this element was 510 nm.

Since each of the layers was enabled to go through the hysteresis of the pattern of the fine recessed/projected portions formed on the surface of the glass substrate on the occasion of forming the layers, it is possible to self-regulatively secure this pattern of the fine recessed/projected portions at each interface of the layers.

It was found, through the comparison with the organic EL element of the aforementioned comparative example, that the organic EL element of Example 11 was 90% higher in brightness in the average of 10 samples than that of the comparative example.

Example 12

A mask layer consisting of a pattern of the PS was formed on a protective film which was usually used for a polarizer by repeating the same procedure as used in Example 2.

By using this mask layer and under the same conditions as employed in Example 2, the film was dry-etched by RIE for about 40 seconds to form a fine pattern of recessed/projected portions on the surface of the protective film. Although a small portion of the PS was left remained on the surface of the film, this residual PS left thereon, since the refractive index of the PS was almost the same as that of the protective film.

As a result, it was possible to form fine recessed/projected portions on the surface of the protective film for a polarizer, wherein the projected portions thereof were featured in that the diameter thereof was about 70 nm and the standard deviation thereof was 15% of a mean circle-equivalent diameter, that the height thereof was about 80 nm and the standard deviation thereof was 18% of mean height, that the circularity coefficient thereof was 0.85, and that the area ratio thereof was 0.4.

Thereafter, the protective film having the fine recessed/projected portions formed thereon was adhered onto the polarizer to obtain a polarizing plate having the fine recessed/projected portions formed thereon.

While a reflectance of a comparative polarizing plate having none of such fine recessed/projected portions was 3% in the visible light zone as a whole (400-800 nm), a reflectance of the polarizing plate which was manufactured in this example was reduced only 0.5% in the visible light zone.

On the other hand, a mask layer consisting of a pattern of the PS was formed on a glass substrate for color filter by repeating the same procedure as used in Example 1. By using this mask layer, the surface of the glass substrate was dry-etched by RIE for about 60 seconds under the same conditions as described above. As a result, a fine pattern was formed on the surface of the glass substrate. The residual PS which was left remained was removed by using an $O_2$ asher.

As a result, it was possible to form fine recessed/projected portions on the surface of the glass substrate, wherein the projected portions thereof were featured in that the diameter thereof was about 70 nm and the standard deviation thereof was 15% of a mean circle-equivalent diameter, that the height thereof was about 80 nm and the standard deviation thereof was 20% of mean height, that the circularity coefficient thereof was 0.85, and that the area ratio thereof was 0.4.

As a layer of $Cr/CrO_x$ was formed by a sputtering method using a mask on the surface of the glass substrate having the fine recessed/projected portions formed thereon, it is possible to self-regulatively secure this pattern of the fine recessed/projected portions at the interface between the glass substrate and the BM layer.

While a reflectance of a glass substrate having the same kind of BM layer formed thereon without the aforementioned fine recessed/projected portions being formed on the glass substrate was 4% in the visible light zone, the glass substrate which was manufactured in this example was reduced only 0.5% in the visible light zone.

The process of coating and exposure of a pigment resist was repeated on the glass substrate having a BM layer formed thereon, thereby forming the layers of RGB. Furthermore, a protective film and a transparent electrode were formed on the glass substrate to obtain a color filter substrate. The polarizing plate prepared as described above was adhered onto the opposite major surface of the color filter substrate, thereby completing the manufacture of an upper glass substrate.

Then, a material for alignment film was coated on the back face glass (TFT substrate) and the resultant alignment film is subjected to rubbing treatment (aligning process). After a spacer was sprayed onto the alignment film, the resultant alignment film is adhered onto the upper glass to obtain a laminate body. Thereafter, the laminate body was placed in a vacuum chamber and a liquid crystal was poured into the space formed by the presence of the spacer. Finally, the redundant portion of the liquid crystal was wiped out and a sealing material was coated thereon and allowed to cure, thereby obtaining the LCD of this example.

In the meantime, an LCD of comparative example was manufactured by repeating the aforementioned procedure except that a glass substrate without the aforementioned fine recessed/projected portions and a polarizing plate without the aforementioned fine recessed/projected portions were used. While a reflectance of the LCD of comparative example exhibited a reflectance of 4% in the visible light zone, the LCD which was manufactured in Example 12 was reduced only 0.5% in the visible light zone.

Example 13

A mask layer consisting of a pattern of the PS was formed on a protective film for a polarizer by repeating the same procedure as used in Example 3.

By using this mask layer and under the same conditions as employed in Example 3, the film was dry-etched by RIE for about 80 seconds to form a fine pattern of recessed/projected portions on the surface of the protective film. Although a small portion of the PS was left remained on the film, this residual PS left thereon, since the refractive index of the PS was almost the same as that of the protective film.

As a result, it was possible to form fine recessed/projected portions on the surface of the protective film for a polarizer, wherein the projected portions thereof were featured in that the diameter thereof was about 110 nm and the standard deviation thereof was 20% of a mean circle-equivalent diameter, that the height thereof was about 200 nm and the standard deviation thereof was 25% of mean height, that the circularity coefficient thereof was 0.85, and that the area ratio thereof was 0.4.

Thereafter, the protective film having the fine recessed/projected portions formed thereon was adhered onto the polarizer to obtain a polarizing plate having the fine recessed/projected portions formed thereon.

While a reflectance of a comparative polarizing plate having none of such fine recessed/projected portions was 3% in the visible light zone, the polarizing plate which was manufactured in this example exhibited a reduced reflectance, i.e. only 0.3% in the visible light zone.

On the other hand, a mask layer consisting of a pattern of the PS was formed on a glass substrate for color filter by repeating the same procedure as employed in Example 4. By using this mask layer, the surface of the glass substrate was further subjected to RIE for two minutes under the same conditions as described above. As a result, a fine pattern was formed on the surface of the glass substrate. The residual PS left remained was removed by using an $O_2$ asher.

As a result, it was possible to form fine recessed/projected portions on the surface of the glass substrate, wherein the projected portions thereof were featured in that the diameter thereof was about 110 nm and the standard deviation thereof was 20% of a mean circle-equivalent diameter, that the height thereof was about 200 nm and the standard deviation thereof was 25% of mean height, that the circularity coefficient thereof was 0.85, and that the area ratio thereof was 0.4.

Then, by using the glass substrate manufactured in this manner, the LCD of this example was manufactured by repeating the same procedure as described in Example 12.

While a reflectance of the LCD of comparative example was 4% in the visible light zone, the LCD manufactured in Example 13 exhibited a reduced reflectance, i.e. only 0.5% in the visible light zone.

Example 14

An imprinting master prepared in Example 8 was press-contacted in vacuum with a protective film for a polarizer. The conditions on this occasion were 150° C. in temperature and 10 MPa in pressure. As a result, it was possible to form fine recessed/projected portions on the surface of the protective film for a polarizer, wherein the projected portions thereof were featured in that the diameter thereof was 100 nm and the standard deviation thereof was 20% of a mean circle-equivalent diameter, that the height thereof was about 150 nm and the standard deviation thereof was 22% of mean height, that the circularity coefficient thereof was 0.85, and that the area ratio thereof was 0.5.

Thereafter, the protective film having the fine recessed/projected portions formed thereon was adhered onto the polarizer to obtain a polarizing plate having the fine recessed/projected portions formed thereon.

While a reflectance of a comparative polarizing plate was 3% in the visible light zone, a reflectance of the polarizing plate which was manufactured in this example was reduced only 0.5% in the visible light zone.

On the other hand, PMMA was coated on a glass substrate for color filter and prebaked at a temperature of 110° C. to form a PMMA film having a thickness of 200 nm. The aforementioned imprinting master was press with this PMMA film in vacuum for 30 minutes at a temperature of 180° C. and a pressure of 10 MPa. As a result, it was possible to form a pattern of PMMA consisting of columnar fine recessed/projected portions, wherein the projected portions thereof were featured in that the diameter thereof was 100 nm and the standard deviation thereof was 20% of a mean circle-equivalent diameter, that the height thereof was about 150 nm and the standard deviation thereof was 25% of mean height, that the circularity coefficient thereof was 0.85, and that the area ratio thereof was 0.5.

Then, by using this pattern of PMMA as a mask, the surface of the glass substrate was dry-etched by RIE for three minutes under the conditions of: 30 sccm in flow rate of $CF_4$, 1.33 Pa (10 mTorr) in pressure and 100 W in electric power.

As a result, it was possible to form fine recessed/projected portions on the surface of the glass substrate, wherein the projected portions thereof were featured in that the diameter thereof was 110 nm and the standard deviation thereof was 20% of a mean circle-equivalent diameter, that the height thereof was about 250 nm and the standard deviation thereof was 28% of mean height, that the circularity coefficient thereof was 0.85, and that the area ratio thereof was 0.5. The residual PMMA was removed by using an $O_2$ asher.

Then, in the same manner as described in Example 12, the LCD of this example was manufactured by using the glass substrate prepared as described above.

While a reflectance the LCD of comparative example was 4% in the visible light zone, a reflectance the LCD manufactured in Example 14 was reduced 0.5% in the visible light zone.

Example 15

By the same procedure as described in Example 9, a resist film, an SOG film and a mask layer were formed on the glass substrate for color filter.

By using this mask layer, the SOG film was subjected to RIE under the conditions of: 30 sccm in flow rate of $CF_4$, 1.33 Pa (10 mTorr) in pressure and 100 W in electric power. Additionally, the resist layer was dry-etched by RIE under the conditions of: 30 sccm in flow rate Of $O_2$, 13.3 Pa (100 mTorr) in pressure and 100 W in electric power, thereby etching the lower resist film and obtaining a columnar fine pattern having a height of 450 nm.

Then, the polymer film was dry-etched under the conditions of: 30 sccm in flow rate of $CF_4$, 1.33 Pa (10 mTorr) in pressure and 100 W in electric power. Finally, the polymer film was dry-etched using oxygen gas to remove the polymer film. Incidentally, the SOG film was already etched away in the previous etching process using $CF_4$ and hence there was no problem with respect to the removal of the SOG film.

As a result, it was possible to perform a deep etching and it was possible, through this etching, to form fine recessed/projected portions on the surface of the glass substrate, wherein the projected portions thereof were featured in that the diameter thereof was about 120 nm and the standard deviation thereof was 30% of a mean circle-equivalent diameter, that the height thereof was about 300 nm and the standard deviation thereof was 35% of mean height, that the circularity coefficient thereof was 0.85, and that the area ratio thereof was 0.4. This shape is advantageous in providing a gradient in refractive index.

Then, in the same manner as described in Example 12, the LCD of this example was manufactured by using the glass substrate prepared as described above.

While the LCD of comparative example exhibited a reflectance of 4% in the visible light zone, the LCD which was manufactured in Example 15 exhibited a reduced reflectance, i.e. only 0.3% in the visible light zone.

Example 16

The polarizing plate which was manufactured in the same manner as described in Example 12 was adhered onto the light input side of the LCD of Example 15 to manufacture the LCD of this example.

It was found that the LCD of this example was 8% higher in brightness than an LCD where neither the glass substrate nor the polarizing plate thereof were provided on the surface thereof with the aforementioned fine recessed/projected portions.

Example 17

In the same manner as described in Example 1, a mask layer consisting of a pattern of the PS was formed on the opposite surfaces of a front glass substrate for PDP.

By using this mask layer and under the same conditions described in Example 1, the both surfaces of the glass substrate were dry-etched by RIE for 60 seconds. As a result, a fine pattern was formed on each of the surfaces of the glass substrate. The pattern of the PS left remained was then removed by using an $O_2$ asher.

As a result, it was possible to form fine recessed/projected portions on the opposite surfaces of the glass substrate, wherein the projected portions thereof were featured in that the diameter thereof was confined within the range of 50 to 70 nm and the standard deviation thereof was 20% of a mean circle-equivalent diameter, that the height thereof was confined within the range of 50 to 80 nm and the standard deviation thereof was 20% of mean height, that the circularity coefficient thereof was 0.85, and that the area ratio thereof was 0.4.

A display electrode as well as a bus electrode were formed, through a procedure including sputtering and exposure, on one of the surfaces of the glass substrate having fine recessed/projected portions formed thereon. Additionally, an MgO layer having a thickness of 200 nm was formed thereover by a vapor deposition method. As a result, the aforementioned fine recessed/projected portions were enabled to be formed self-regulatively at each of the interfaces.

Subsequently, for the purpose of adhering a top glass onto a back glass substrate having pixels formed thereon, a sealing material was attached to a marginal portion of the back glass substrate. Thereafter, the top glass substrate and the back glass substrate were contacted with each other and heated at a temperature of 400° C. to melt the sealing material and adhere them to each other, thereby accomplishing the PDP of this example.

In the meantime, an LCD of comparative example was manufactured by repeating the aforementioned procedure except that a glass substrate without the aforementioned fine recessed/projected portions was used. While a reflectance of the PDP of comparative example was 5% in the visible light zone, a reflectance of the PDP which was manufactured in this example was reduced only 0.7% in the visible light zone.

Example 18

In the same manner as described in Example 4, a mask layer consisting a pattern of the PS was formed on the surface of a front glass substrate for PDP.

By using this mask layer and under the same conditions described in Example 4, the surface of the glass substrate was dry-etched by RIE for two seconds. As a result, a fine pattern was formed on the surface of the glass substrate. The residual portion of PS left remained was then removed by using an $O_2$ asher.

As a result, it was possible to form fine recessed/projected portions on the surface of the glass substrate, wherein the projected portions thereof were featured in that the diameter thereof was 110 nm and the standard deviation thereof was 20% of a mean circle-equivalent diameter, that the height thereof was 200 nm and the standard deviation thereof was 25% of mean height, that the circularity coefficient thereof was 0.85, and that the area ratio thereof was 0.4.

In the same procedures as described in Example 17, a display electrode, a bus electrode, an MgO layer and a back glass substrate were formed on the surface of the glass substrate having fine recessed/projected portions formed thereon, thereby manufacturing the PDP of this example. As a result, the aforementioned fine recessed/projected portions were enabled to be formed self-regulatively at each of the interfaces.

While the PDP of comparative example exhibited a reflectance of 5% in the visible light zone, the PDP manufactured in this example exhibited a reduced reflectance, i.e. only 0.5% in the visible light zone.

Example 19

PMMA was coated on a front glass substrate and prebaked at a temperature of 110° C. to form a PMMA film having a thickness of 200 nm. The aforementioned imprinting master formed by the same manner described in Example 8 was pressed with this PMMA film in vacuum for 30 minutes at a temperature of 180° C. and a pressure of 10 MPa. As a result, it was possible to form a pattern of PMMA consisting of columnar fine recessed/projected portions, wherein the projected portions thereof were featured in that the diameter thereof was 100 nm and the standard deviation thereof was 20% of a mean circle-equivalent diameter, that the height thereof was about 150 nm and the standard deviation thereof was 25% of mean height, that the circularity coefficient thereof was 0.85, and that the area ratio thereof was 0.5.

Then, by using this pattern of PMMA as a mask, the surface of the glass substrate was dry-etched by RIE for three minutes under the conditions of: 30 sccm in flow rate of $CF_4$, 1.33 Pa (10 mTorr) in pressure and 100 W in electric power.

As a result, it was possible to form fine recessed/projected portions on the surface of the glass substrate, wherein the projected portions thereof were featured in that the diameter thereof was 110 nm and the standard deviation thereof was 20% of a mean circle-equivalent diameter, that the height thereof was about 250 nm and the standard deviation thereof was 28% of mean height, that the circularity coefficient thereof was 0.85, and that the area ratio thereof was 0.5. The residual PMMA was removed by using an $O_2$ asher.

In the same procedures as described in Example 17, a display electrode, a bus electrode, an MgO layer and a back glass substrate were formed on the surface of the glass substrate having fine recessed/projected portions formed thereon, thereby manufacturing the PDP of this example. As a result, the aforementioned fine recessed/projected portions were enabled to be formed self-regulatively at each of the interfaces.

While a reflectance of the PDP of comparative example was 5% in the visible light zone, a reflectance of the PDP manufactured in this example was reduced only 0.5% in the visible light zone.

Example 20

In the same manner as described in Example 9, a resist film, SOG film and a mask layer were formed on the opposite surfaces of a front glass substrate.

By using this mask layer, the SOG film was dry-etched by RIE under the conditions of: 30 sccm in flow rate of $CF_4$, 1.33 Pa (10 mTorr) in pressure and 100 W in electric power. Additionally, the resist layer was dry-etched by RIE under the conditions of: 30 sccm in flow rate of $O_2$, 13.3 Pa (100 mTorr) in pressure and 100 W in electric power, thereby etching the lower resist film and obtaining a columnar fine pattern having a height of 450 nm.

Then, the polymer film was dry-etched under the conditions of: 30 sccm in flow rate of $CF_4$, 1.33 Pa (10 mTorr) in pressure and 100 W in electric power. Finally, the polymer film was dry-etched using oxygen gas to remove the polymer film. Incidentally, the SOG film was already etched away in the previous etching process using $CF_4$ and hence there was no problem with respect to the removal of the SOG film.

As a result, it was possible to perform a deep etching and it was possible, through this etching, to form fine recessed/projected portions on the surface of the glass substrate, wherein the projected portions thereof were featured in that the diameter thereof was about 120 nm and the standard deviation thereof was 30% of a mean circle-equivalent diameter, that the height thereof was about 300 nm and the standard deviation thereof was 35% of mean height, that the circularity coefficient thereof was 0.85, and that the area ratio thereof was 0.5. This configuration is advantageous in providing a gradient in refractive index.

In the same procedures as described in Example 17, a display electrode, a bus electrode, an MgO layer and a back glass substrate were formed on the surface of the glass substrate having fine recessed/projected portions formed thereon, thereby manufacturing the PDP of this example. As a result, the aforementioned fine recessed/projected portions were enabled to be formed self-regulatively at each of the interfaces.

While a reflectance of the PDP of comparative example was 5% in the visible light zone, a reflectance of the PDP manufactured in this example was reduced only 0.3% in the visible light zone.

According to one embodiment of the present invention, it is possible to provide a display device which is capable of effectively retrieving the light inside a device and also capable of minimizing the reflectance of the display side layer. Further, according to another embodiment of the present invention, it is possible to provide a method of manufacturing a transparent substrate, which makes it possible to obtain, with high productivity and at a low cost, a display device which is capable of effectively retrieving the light inside a device and also capable of minimizing the reflectance of the display side layer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A display device comprising:
 a substrate;
 a laminate structure formed on the substrate and comprising a plurality of layers including a display region and an outermost layer of the laminate structure, wherein one of the outermost layer of the laminate structure and the substrate constitutes a display side outermost layer; and
 recessed/projected portions formed at least one of an outermost surface of the display side outermost layer, a display side surface of the display region, and an interface existing between the display region and the display side outermost layer, projected portions of the recessed/projected portions having a mean circle-equivalent diameter ranging from 50 nm to 250 nm with the standard deviation of circle-equivalent diameter of the projected portions being within the range of 10 to 50% of the mean circle-equivalent diameter, and a mean height ranging from 100 nm to 500 nm with the standard deviation of height being within the range of 10 to 50% of the mean height; and the projected portions having a circularity coefficient ranging from 0.6 to 1, and an occupation ratio ranging from 20 to 75%, the occupation ratio being a ratio of a total area of projected portions to a total area of the projected portions and flat portions.

2. The display device according to claim 1, wherein the substrate is a transparent substrate and constitutes the display side outermost layer; the plurality of layers of the laminate structure comprises a pair of electrodes and a luminous layer between the pair of electrodes; one of the pair of electrodes is formed on the transparent substrate; and the display device is an organic EL display device.

3. The display device according to claim 1, wherein the substrate is a TFT substrate; the plurality of layers of the laminate structure comprises a liquid crystal layer and a color filter substrate formed on the liquid crystal layer; the color filter substrate comprises a transparent substrate having a color filter and a black matrix formed thereon; the display side outermost layer is located on the color filter substrate; and the display device is a liquid crystal display device.

4. The display device according to claim 1, wherein the substrate is a transparent supporting substrate; the laminate structure comprises a pair of electrodes and an electric discharge cell between the pair of electrodes, one of the pair of electrodes is a display side transparent electrode; the display side outermost layer is located on the display side transparent electrode; and the display device is a plasma display device.

* * * * *